US012652999B2

(12) United States Patent
Cheng et al.

(10) Patent No.: US 12,652,999 B2
(45) Date of Patent: Jun. 9, 2026

(54) ROBOT, APPARATUS INCLUDING ROBOT, AND METHOD FOR MANUFACTURING SEMICONDUCTOR STRUCTURE USING THE SAME

(71) Applicant: TAIWAN SEMICONDUCTOR MANUFACTURING COMPANY, LTD., Hsinchu (TW)

(72) Inventors: Chia-Yun Cheng, Hsinchu (TW); Kenichi Sano, Hsinchu (TW); Yu-Wei Lu, Hsinchu (TW); Yi-Chen Lo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 488 days.

(21) Appl. No.: 18/156,217

(22) Filed: Jan. 18, 2023

(65) Prior Publication Data

US 2024/0243001 A1     Jul. 18, 2024

(51) Int. Cl.
| | |
|---|---|
| *H10P 72/76* | (2026.01) |
| *B25J 15/10* | (2006.01) |
| *H01J 37/20* | (2006.01) |
| *H01J 37/317* | (2006.01) |
| *H10P 30/40* | (2026.01) |
| *H10P 50/28* | (2026.01) |
| *H10P 72/72* | (2026.01) |

(52) U.S. Cl.
CPC .......... *H10P 72/7624* (2026.01); *B25J 15/10* (2013.01); *H01J 37/20* (2013.01); *H01J 37/3171* (2013.01); *H10P 30/40* (2026.01);

*H10P 50/283* (2026.01); *H10P 72/72* (2026.01); *H01J 2237/0203* (2013.01); *H01J 2237/2007* (2013.01)

(58) Field of Classification Search
CPC ........... H01L 21/68785; H01L 21/6831; H01L 21/31111; H01L 21/31155; B25J 15/10; H01J 37/20; H01J 37/3171; H01J 2237/0203; H01J 2237/2007
USPC ..................................................... 156/345.54
See application file for complete search history.

(56) References Cited

U.S. PATENT DOCUMENTS

| | | | | |
|---|---|---|---|---|
| 6,702,865 B1* | 3/2004 | Ozawa | ................... | H01L 21/682 |
| | | | | 414/940 |
| 2005/0133738 A1* | 6/2005 | Joo | ......................... | H01J 37/08 |
| | | | | 315/111.81 |
| 2005/0245064 A1* | 11/2005 | Tsao | ................... | H01L 21/68707 |
| | | | | 257/E21.585 |
| 2006/0258128 A1* | 11/2006 | Nunan | ..................... | H01J 37/09 |
| | | | | 414/217 |
| 2016/0181132 A1* | 6/2016 | Anella | ................. | H05B 3/0047 |
| | | | | 219/494 |

(Continued)

*Primary Examiner* — Charlee J. C. Bennett
(74) *Attorney, Agent, or Firm* — Birch, Stewart, Kolasch & Birch, LLP

(57) ABSTRACT

An apparatus includes a supporting frame, a platform supported by the supporting frame and having a first side and a second side opposite to the first side, and at least three robot fingers which are mounted to the supporting frame, and which are angularly displaced from each other. Each of the robot fingers has a fingertip configured to retain a substrate on the first side of the platform such that the substrate is spaced apart from the platform. A method for manufacturing a semiconductor structure using the apparatus is also disclosed.

20 Claims, 18 Drawing Sheets

(56) References Cited

U.S. PATENT DOCUMENTS

| | | | |
|---|---|---|---|
| 2016/0196951 A1* | 7/2016 | Ohsawa ............... | H01J 37/3053 |
| | | | 250/492.3 |
| 2018/0144956 A1* | 5/2018 | Takaoka ............ | H01L 21/67098 |
| 2020/0402759 A1* | 12/2020 | Higashi ................... | H01J 27/08 |
| 2022/0221086 A1* | 7/2022 | Leys ..................... | B32B 27/288 |

* cited by examiner

ROBOT, APPARATUS INCLUDING ROBOT, AND METHOD FOR MANUFACTURING SEMICONDUCTOR STRUCTURE USING THE SAME

BACKGROUND

Transistors are key active components in modern integrated circuits (ICs). With rapid development of semiconductor technology, critical dimension (CD) of transistors keeps shrinking and various three-dimensional (3D) transistor structures are springing up, making it possible to integrate a large number of transistors per unit area. Till date, a method for manufacturing advanced node transistors and manufacturing equipment used in the method are under continuous development, so that mass production of ICs including the advanced node transistors may achieve high product yield with low cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
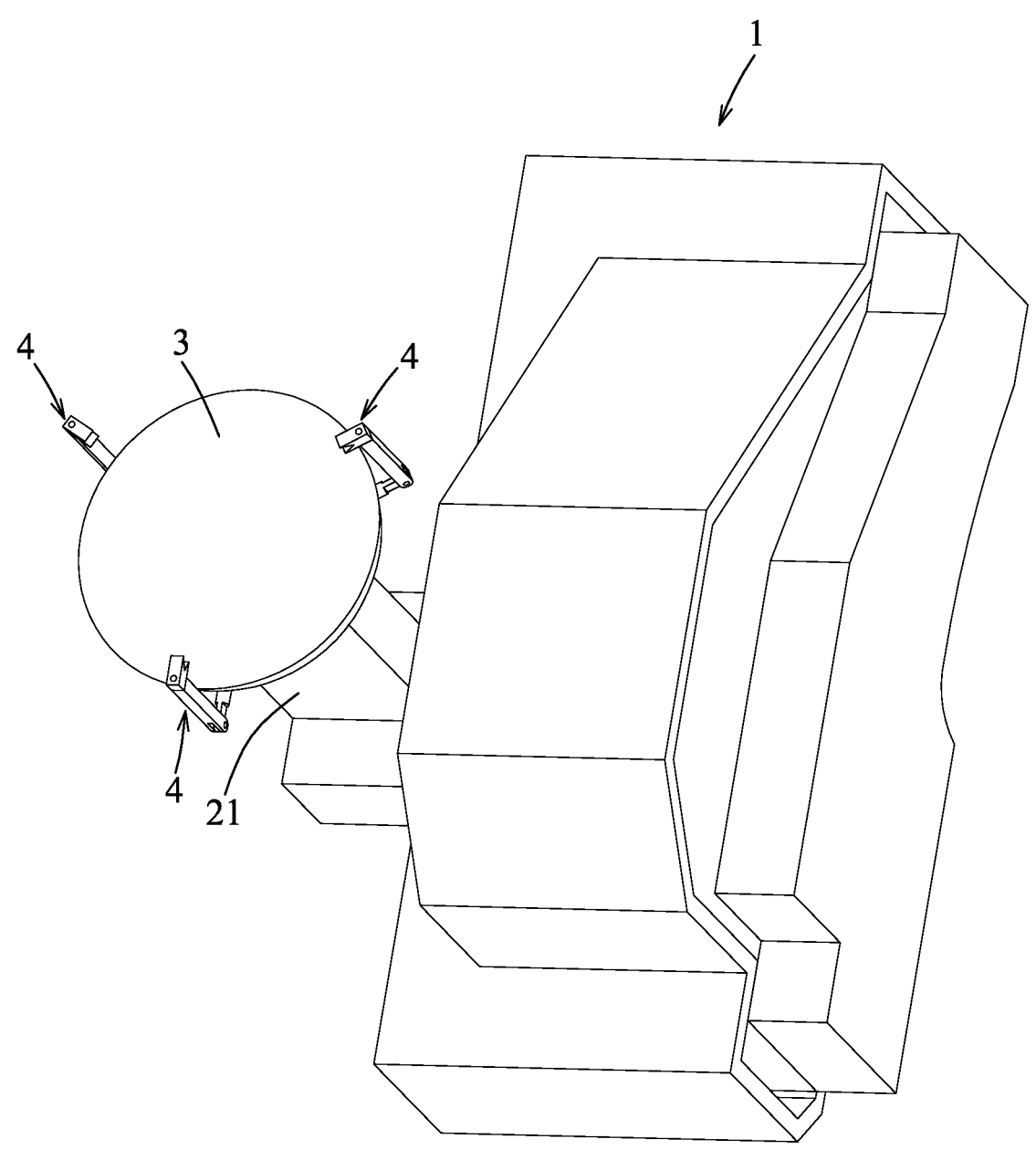
FIG. 1 is a schematic view illustrating a robot in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

Figure 2:
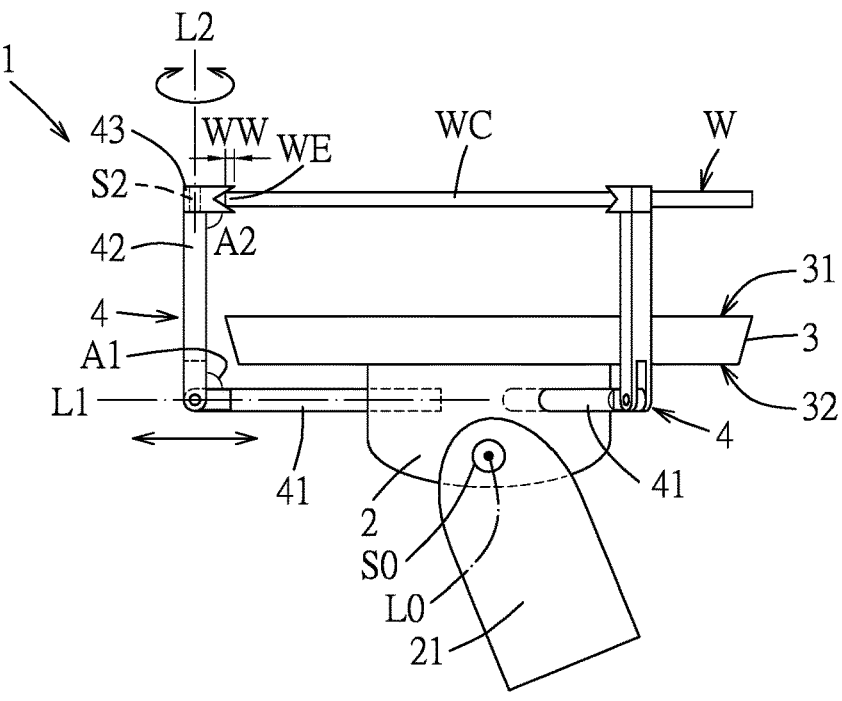
FIG. 2 is a partially enlarged side view of the robot illustrating robot fingers in a retaining position in accordance with some embodiments.
Figure 3:
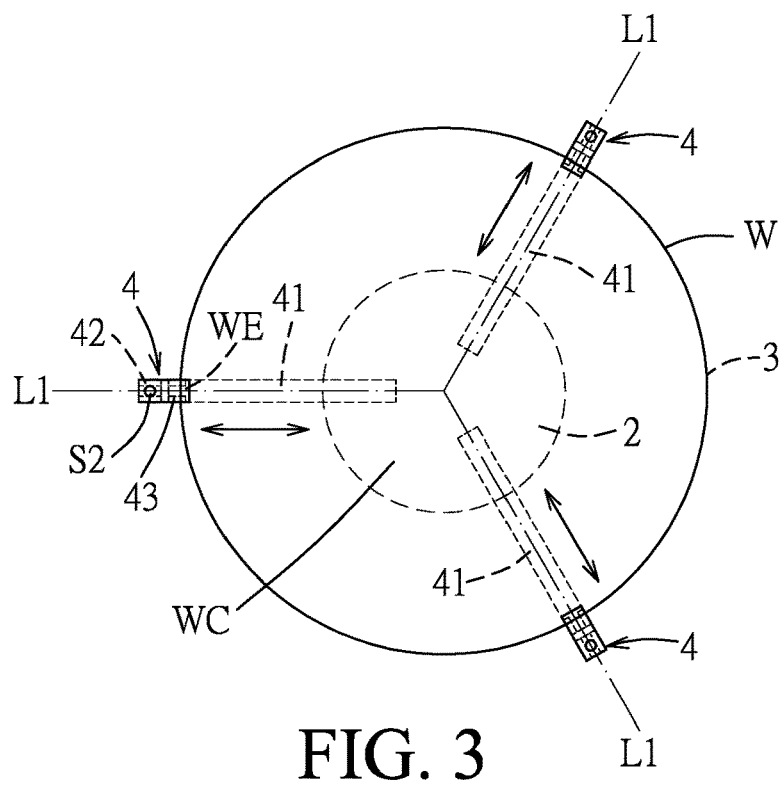
FIG. 3 is a top view of the robot with the robot fingers in the retaining position as viewed from the side view shown in FIG. 2 in accordance with some embodiments.

When a wafer is subjected to a film deposition process to form a film on a semiconductor structure at a frontside of the wafer, both of the frontside and a backside of the wafer may be formed with the film according to characteristics of the film deposition process. In general, the frontside of the wafer is faced up and will be further processed whereas the backside of the wafer is placed to be in direct contact with a retainer of an apparatus for processing the wafer. When the film has a hardness that is greater than that of the retainer, the retainer may be gradually consumed and damaged by friction against the film on the backside of the wafer during placement and/or removal of the wafer in each process cycle, and thus the retainer needs to be replaced, thereby resulting in a high cost of maintenance of the apparatus. In some cases, according to the material composition of the film, the film on the backside of the wafer can be removed by a wet etching process whereas the film and the semiconductor structure on the frontside of the wafer remain intact. In some other cases, the film made of some materials (for example, but not limited to, silicon oxycarbon nitride) is difficult to be removed by merely using a wet etching process, or can only be removed at an extremely slow etching rate in the wet etching process (e.g., the etching rate may be about 4 Å/min using a high-temperature sulfuric acid and hydrogen peroxide mixture (SPM), or about 1 nm/min using diluted hydrogen fluoride (DHF) including HF and wafer in a ratio (by volume) of 1:1 at ambient temperature). For the film material which is difficult to be removed by merely using a wet etching process, the film on the backside of the wafer may be effectively removed by a dry etching process (e.g., using $NF_3/H_2$ etchant) at an etching rate about 30 nm/min when the backside of the wafer is faced up. However, the frontside of the wafer needs to be placed on a retainer during removal of the film on the backside of the wafer, which may cause undesirable damage or contamination of the film and the semiconductor structure on the frontside of the wafer. Therefore, the present disclosure is directed to a robot for retaining the wafer, an apparatus including the robot, and an effective method for removing the film on the backside of the wafer using the apparatus without damage and/or contamination of the frontside of the wafer. The robot may be applied to an implantation apparatus, but is not limited thereto. The robot in this disclosure may be applied to a dry etching apparatus or other suitable apparatuses as well after appropriate modification. FIG. 1 is a schematic view illustrating a robot 1 in accordance with some embodiments. FIG. 2 is a partially enlarged side view of the robot 1 in accordance with some embodiments. FIG. 3 is a top view of the robot 1 as viewed from the side view shown in FIG. 2 in accordance with some embodiments.

The robot 1 includes a supporting frame 2, a platform 3, and at least three robot fingers 4.

The platform 3 is supported by the supporting frame 2, and has a first side 31 and a second side 32 opposite to the first side 31. In some embodiments, the platform 3 includes an electrostatic chuck.

The robot fingers 4 are mounted to the supporting frame 2, and are angularly displaced from each other. Each of the robot fingers 4 has a fingertip 43 configured to retain a substrate (W) on the first side 31 of the platform 3 such that the substrate (W) is spaced apart from the platform 3. In some embodiments, the fingertip 43 has a groove configured to receive an edge portion (WE) of the substrate (W) without touching a main portion (WC) of the substrate (W) surrounded by the edge portion (WE). In some embodiments, as shown in FIG. 2, the edge portion (WE) engaged in the groove may have a width (WW) of about 0.1% to about 1% of a radius of the substrate (W). In some embodiments, the width (WW) of the edge portion (WE) is about 0.15 mm to about 1.5 mm. In some embodiments, the groove may be configured in a V-shape, or a U-shape, but is not limited thereto. Other suitable configurations suitable for retaining the substrate (W) are within the contemplated scope of the present disclosure. In FIG. 1, the number of the robot fingers 4 is three, while in some other embodiments, the number of the robot fingers 4 may be four, five, six or other suitable number. Although the platform 3 does not function to retain the substrate (W) thereon, the platform 3 may be used to retain another substrate (not shown) produced in other processes since the platform 3 includes the electrostatic chuck.

In some embodiments, the robot fingers 4 may be equiangular to each other such that the substrate (W) may be retained stably, although they are not limited thereto. It is noted that a relative position among the robot fingers 4 may be adjusted according to configuration of a transfer unit (for example, but not limited to, a transfer unit 8 shown in FIG. 20), such that during transportation of the substrate (W) between the robot 1 and the transfer unit 8, the presence of the robot fingers 4 may not interfere the operation of the transfer unit.

Figure 4:
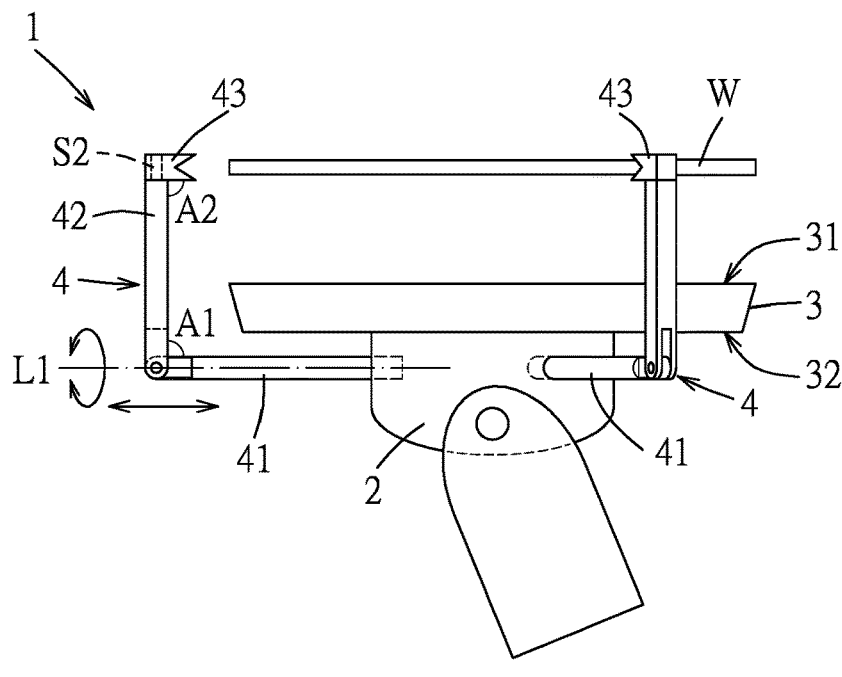
FIGS. 4 and 5 are views respectively similar to those of FIGS. 2 and 3, but illustrating the robot fingers in a lift-up position in accordance with some embodiments.
Figure 5:
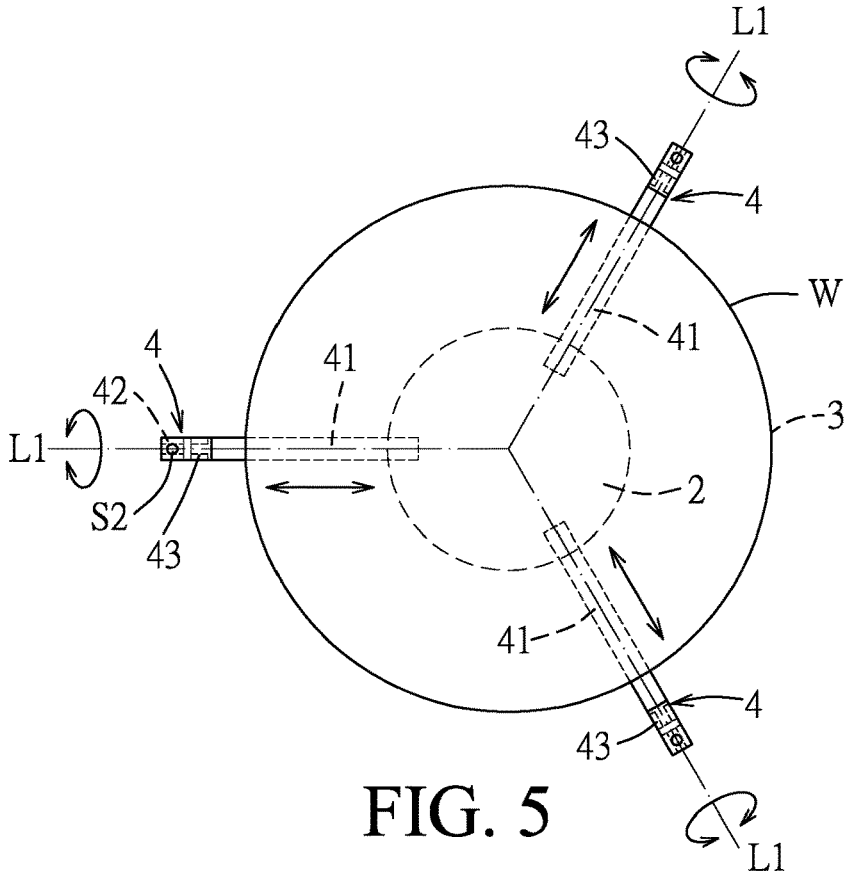
Figure 6:
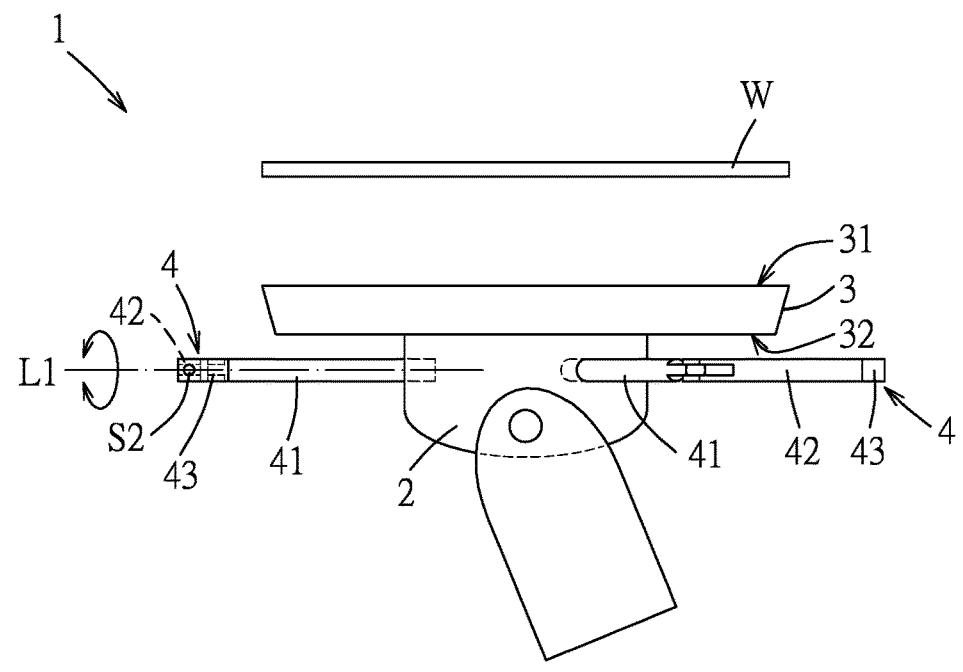
FIGS. 6 and 7 are views respectively similar to those of FIGS. 4 and 5, but illustrating the robot fingers in a lay-down position in accordance with some embodiments.
Figure 7:
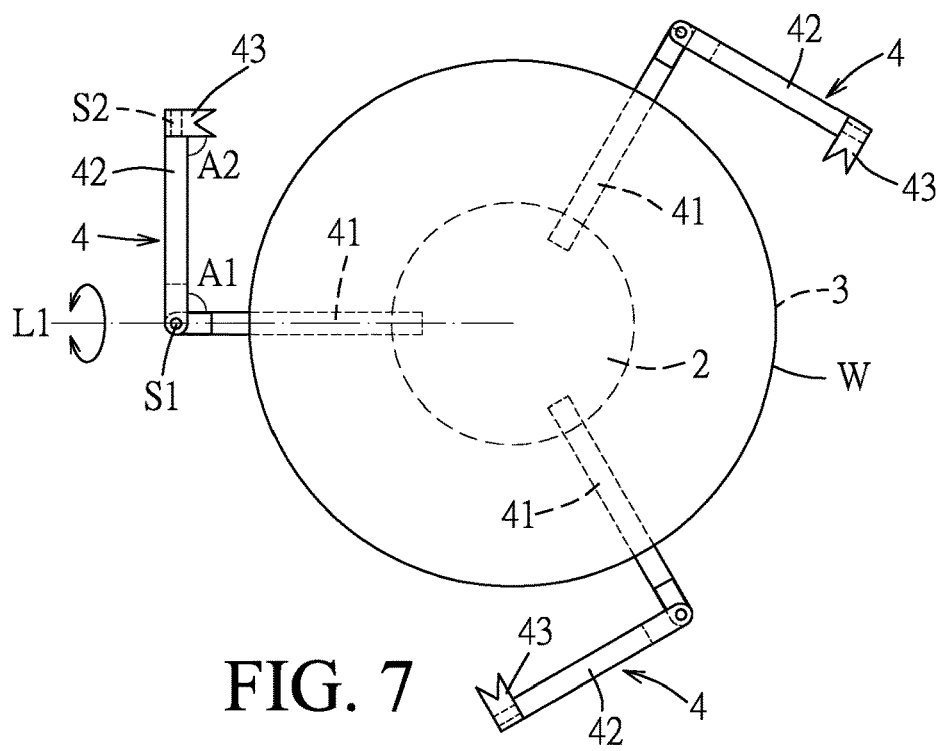

FIGS. 2 and 3 illustrate the robot fingers 4 in a retaining position in accordance with some embodiments. FIGS. 4 and 5 are views respectively similar to those of FIGS. 2 and 3, but illustrating the robot fingers 4 in a lift-up position in accordance with some embodiments. FIGS. 6 and 7 are views respectively similar to those of FIGS. 4 and 5, but illustrating the robot fingers 4 in a lay-down position in accordance with some embodiments. When in the retaining position, the fingertips 43 of the robot fingers 4 are disposed at the first side 31, and cooperatively retain the substrate (W). When in the lift-up position, the fingertips 43 of the robot fingers 4 are disposed at the first side 31 of the platform 3, and are in free contact with the substrate (W). When in the lay-down position, the robot fingers 4 are disposed at the second side 32 of the platform 3. In some embodiments, the robot fingers 4 are operable to move among the retaining position, the lift-up position and the lay-down position.

In some embodiments, each of the robot fingers 4 further includes a first segment 41 mounted to the supporting frame 2, and a second segment 42 connected between the first segment 41 and the fingertip 43 to form a first angle A1 (see FIGS. 2, 4, 7 and 9) with the first segment 41, and to form a second angle A2 (see FIGS. 2, 4, 7 and 9) with the fingertip 43. In some embodiments, the first angle A1 and the second angle A2 may not change during movement of each of the robot fingers 4 among the retaining position, the lift-up position and the lay-down position. In some embodiments, a sum of the first angle A1 and the second angle A2 is about 180 degree when the robot fingers 4 are in each of the retaining position, the lift-up position and the lay-down position. For example, but not limited to, both of the first angle A1 and the second angle A2 are about 90 degree.

In some embodiments, the first segment 41 is elongated along a first axis L1, and is actuable to rotate about the first axis L1 relative to the supporting frame 2 such that by actuating the first segments 41 of the robot fingers 4 to rotate relative to the supporting frame 2, the fingertips 43 of the robot fingers 4 are permitted to be moved between the first and second sides 31, 32 of the supporting frame 3. In other words, by rotation of the first segments 41 of the robot fingers 4, the robot fingers 4 are permitted to be moved between the lift-up position (see FIGS. 4 and 5) and the lay-down position (FIGS. 6 and 7).

In some embodiments, the first segment 41 is actuable to slide along the first axis L1 relative to the supporting frame 2 between an extended position and a retracted position. When the robot fingers 4 are in each of the lay-down position (see FIG. 7) and the lift-up position (see FIG. 5), the first segment 41 is in the extended position. When the fingertips 43 of the robot fingers 4 are at the first side 31 of the supporting frame 3 (see FIG. 4), by actuating the first segments 41 of the robot fingers 4 to slide from the extended position toward the retracted position, the robot fingers 4 are moved from the lift-up position (see FIG. 5) to the retaining position (see FIG. 3).

Figure 8:
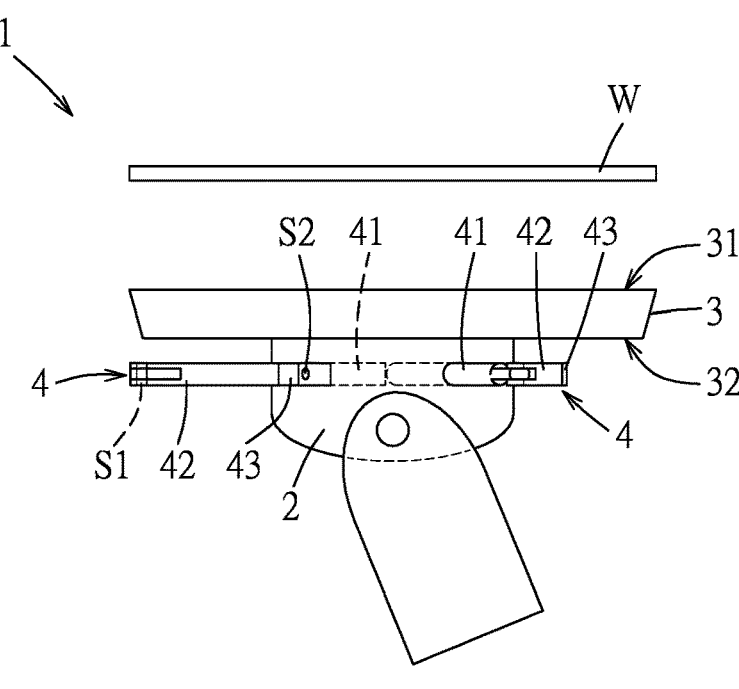
FIGS. 8 and 9 are views respectively similar to those of FIGS. 6 and 7, but illustrating the robot fingers in a collapsed position in accordance with some embodiments.
Figure 9:
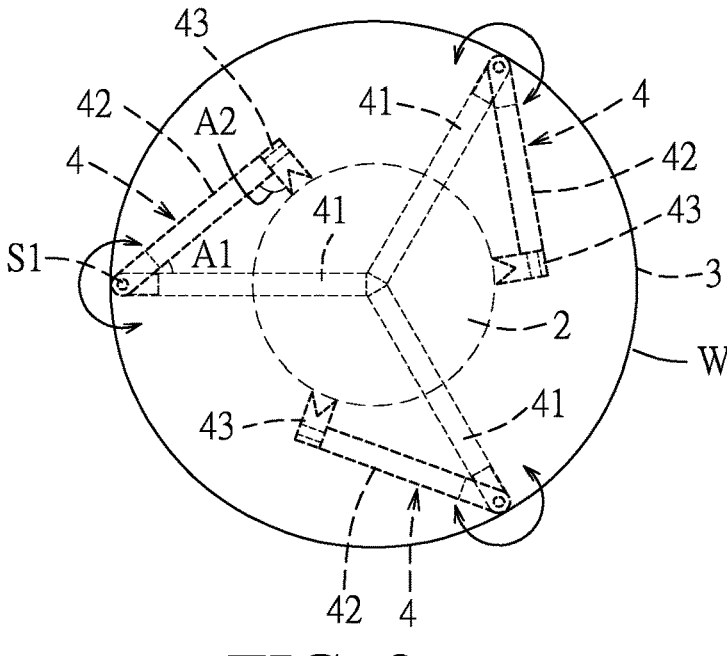

FIGS. 8 and 9 are views respectively similar to those of FIGS. 6 and 7, but illustrating the robot fingers 4 in a collapsed position in accordance with some embodiments.

In some embodiments, the second segment 42 is actuable to rotate relative to the first segment 41, so as to permit the robot fingers 4 to be further operable to move between the lay-down position and the collapsed position.

When the robot fingers 4 are in the collapsed position, as shown in FIG. 9, the first segment 41 is in the retracted position. The fingertip 43 is proximate to the supporting frame 2 when the robot fingers 4 are in the collapsed position (see FIG. 9), and is distal from the supporting frame 2 when the robot fingers 4 are in the lay-down position (see FIG. 7), such that in response to movement of the robot fingers 4 from the collapsed position to the lay-down position, the first angle A1 between the first and second segments 41, 42 is increased. More particularly, the second segment 42 is pivotally connected to the first segment 41 through a first pin S1 such that the first angle A1 is adjustable by actuating rotation of the second segment 42 relative to the first segment 41 about a longitudinal axis of the first pin S1.

In some embodiments, when the robot fingers 4 are in the collapsed position, the first angle A1 is an acute angle. In some embodiments, when the robot fingers 4 are in the lay-down position, the first angle A1 may be or close to a right angle.

In some embodiments, each of the robot fingers 4 may be moved from the collapsed position (see FIG. 9) to the lay-down position (see FIG. 7) by sub-steps of (i) actuating the first segment 41 to slide from the retracted position to the extended position, and (ii) actuating the second segment 42 to rotate counterclockwise about the longitudinal axis of the first pin S1 and to increase the first angle A1 to a predetermined value (e.g., about 90 degree), thereby displacing the robot fingers 4 to the lay-down position. In some alternative embodiments, each of the robot fingers 4 may be moved from the collapsed position (see FIG. 9) to the lay-down position (see FIG. 7) by sub-steps of (i) actuating the second segment 42 to rotate counterclockwise about the longitudinal axis of the first pin S1 and to increase the first angle A1 to the predetermined value, and (ii) actuating the first segment 41 to slide from the retracted position to the extended position, thereby displacing the robot fingers 4 to the lay-down position.

In some other embodiments, instead of actuating the first segment 41, each of the robot fingers 4 may be displaced from the lift-up position to be in the retaining position by actuating the fingertip 43 to rotate relative to the second segment 42.

Figure 10:
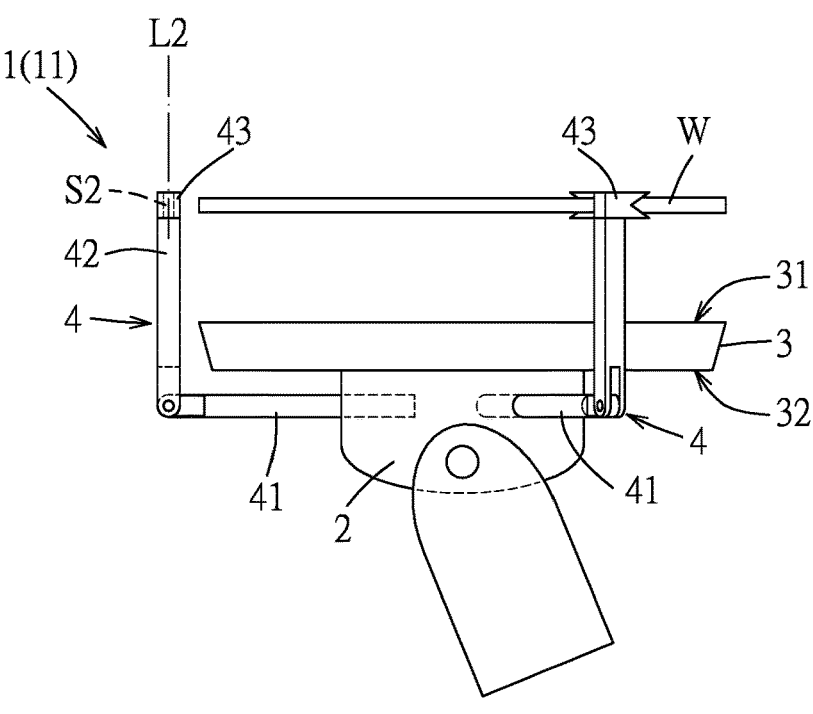
FIGS. 10 and 11 are views respectively similar to those of FIGS. 4 and 5, but illustrating the robot fingers in the lift-up position in accordance with some other embodiments.
Figure 11:
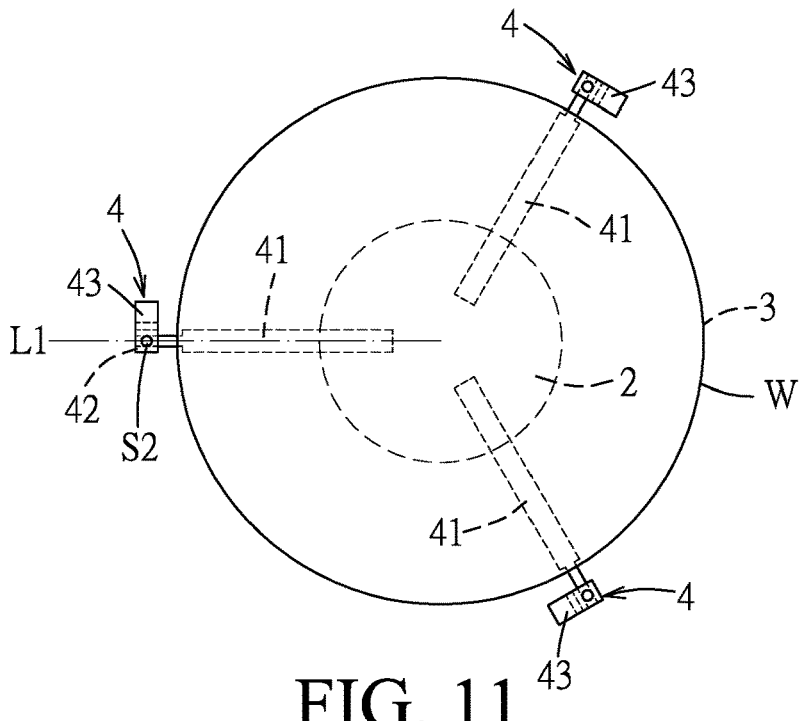

FIGS. 10 and 11 are views respectively similar to those of FIGS. 4 and 5, but illustrating the robot fingers 4 in the lift-up position in accordance with some other embodiments.

In some embodiments, the second segment 42 is elongated along a second axis L2. The fingertip 43 is actuable to rotate relative to the second segment 42 about the second axis L2 so as to permit the robot fingers 4 to be displaced between the retaining position (see FIGS. 2 and 3) and the lift-up position (see FIGS. 10 and 11). More particularly, the fingertip 43 is pivotally connected to the second segment 42 through a second pin S2 elongated along the second axis L2 so as to permit the fingertip 43 to be actuated to rotate about the second axis L2. In some embodiments, during rotation of the fingertip 43 relative to the second segment 42, the second angle A2 (see FIG. 2) between the second segment 42 and the fingertip 43 is substantially not changed.

In some embodiments, as shown in FIG. 2, the robot 1 further includes a movable unit 21 which may be actuable to move up and down, and which is pivotally connected to the supporting frame 2 through a connection pin S0, so as to permit the supporting frame 2 to be actuated to turn relative to the movable unit 21 about a longitudinal axis L0 of the connection pin S0. By actuating the supporting frame 2 (together with the platform 3, the robot fingers 4 and the substrate (W)) to tune relative to the movable unit 21, the supporting frame 2 is permitted to be moved between a first position (see FIGS. 2, 4, 6, 8 and 10) and a second position (see FIGS. 1 and 12). When the fingertips 43 of the robot fingers 4 are moved to hold or release the substrate (W), the supporting frame 2 is in the first position so as to permit the first side 31 of the platform 3 to, for example, but not limited to, face upward. During a process for treating the substrate (W), the supporting frame 2 may be displaced from the first position to the second position so as to permit the substrate (W) retained at the first side 31 of the platform 3 to be treated (e.g., implanted with ions).

Figure 12:
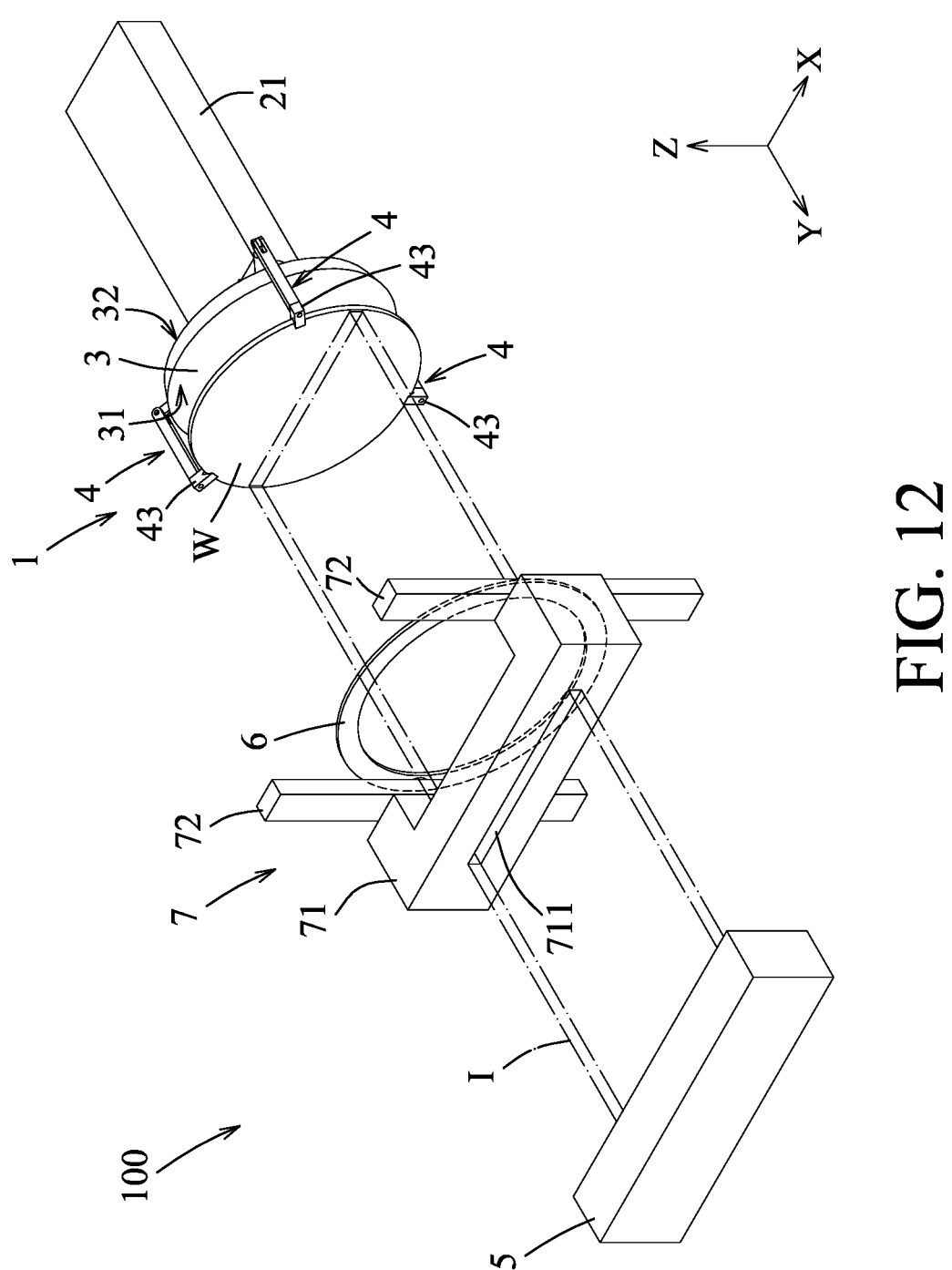
FIG. 12 is a schematic view illustrating an apparatus for treating a substrate in accordance with some embodiments.

FIG. 12 is a schematic view illustrating an apparatus 100 for treating the substrate (W) in accordance with some embodiments. In some embodiments, the apparatus 100 is configured to perform an ion implantation process on the substrate (W) which is retained by the robot 1 (a portion of the robot 1 is shown in FIG. 12). The apparatus 100 includes the robot 1 for retaining the substrate (W), an ion beam generator 5 disposed to apply an ion beam (I) to the substrate (W), and a protective ring 6 disposed between the ion beam generator 5 and the robot 1 such that when the ion beam (I) is applied on the substrate (W), the robot fingers 4 are shielded by the protective ring 6. Therefore, the robot fingers 4 may be prevented from being damaged by the ion beam (I).

The protective ring 6 is made of a material which is able to capture ions (or dopants) in the ion beam (I) so as to prevent the fingertips 43 of the robot fingers 4 of the robot 1 from being gradually consumed by repeating bombardment of the ions (or the dopants). In addition, the protective ring 6 is configured to be grounded so as to release extra charges, thereby reducing occurrence of arcing. In some embodiments, the protective ring 6 is made of an electrically conductive carbon-containing material. In some embodiments, the protective ring 6 is made of graphite. Other materials suitable for forming the protective ring 6 are within the contemplated scope of the present disclosure.

Figure 13:
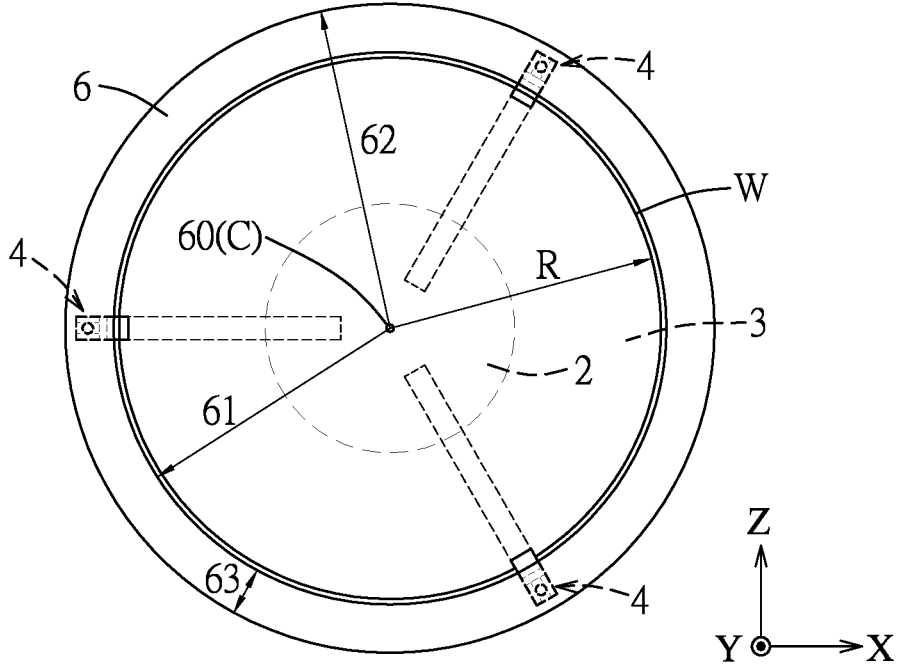
FIG. 13 is a schematic view illustrating a relationship between a protective ring and the substrate in accordance with some embodiments.

FIG. 13 is a schematic view illustrating a relationship between the protective ring 6 and the substrate (W) as view in an incident direction (i.e., a Y direction) of the ion beam (I) in the ion implantation process in accordance with some embodiments.

The protective ring 6 has a center 60 which is kept in alignment with a center (C) of the substrate (W) during the ion implantation process. The protective ring 6 has an inner radius 61 and an outer radius 62. In some embodiments, the inner radius 61 is not less than a radius (R) of the substrate (W) by about 0.5 mm, and is not greater than the radius (R) of the substrate (W) by about 0.5 mm. In some embodiments, a difference 63 between the inner and outer radii 61, 62 ranges from about 10 mm to about 30 mm.

In some embodiments, as shown in FIG. 12, in the ion implantation process where the ion beam (I) is kept still, by actuating the movable unit 21 (see FIG. 2) to move up and down, the substrate (W) may be moved with the movable unit 21 along a Z direction transverse to the Y direction, so as to permit the substrate (W) to be entirely scanned by the ion beam (I). In this case, the protective ring 6 may be moved along with the substrate (W) so as to maintain the relationship between the protective ring 6 and the substrate (W) as shown in FIG. 13.

In some embodiments, the apparatus 100 further includes an ion beam extraction device 7 disposed between the ion beam generator 5 and the robot 1, as shown in FIG. 12. The ion beam extraction device 7 is configured for controlling a beam size (e.g., a width or a height of a parallel beam) of the ion beam (I) and adjusting the ion beam (I) so as to have a desired dosage. In some embodiments, the ion beam extraction device 7 may be configured to be assembled with the protective ring 6 such that the protective ring 6 is disposed between the ion beam extraction device 7 and the robot 1.

Figure 14:
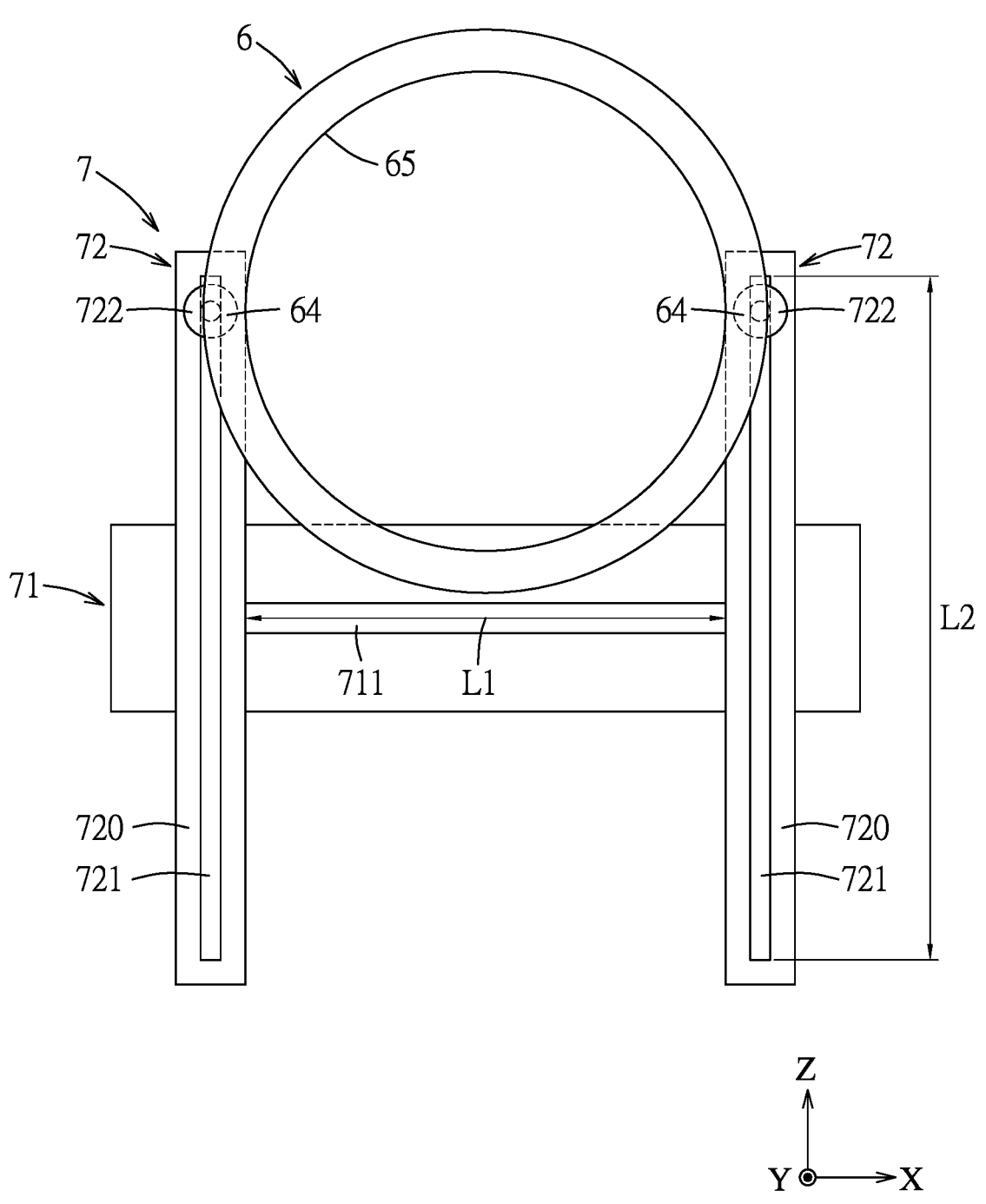
FIG. 14 is a fragmentary enlarged view illustrating the protective ring and an ion beam extraction device in accordance with some embodiments.

FIG. 14 is a fragmentary enlarged view illustrating the protective ring 6 and the ion beam extraction device 7 as view in the incident direction (i.e., the Y direction) of the ion beam (I) in accordance with some embodiments.

The ion beam extraction device 7 includes a main portion 71 and two guiding portions 72 for guiding movement of the protective ring 6. The main portion 71 is formed with a slit 711 for the ion beam (I) to pass through. In some embodiments, the slit 711 is elongated in an X direction transverse to both the Y and Z directions, and has a length L1 greater than a diameter of the substrate (W, see FIG. 13). The two guiding portions 72 are connected to the main portion 71, and are located at two opposite sides of the slit 711 in the X direction. In some embodiments, the X, Y and Z directions are perpendicular to one another.

In some embodiments, each of the guiding portions 72 has a guide rail 720 and a guided piece 722. The guide rail 720 is formed with a guiding slot 721 elongated in the Z direction. The guided piece 722 has two ends, one of which is slidably engaged in the guiding slot 721 and the other of which is configured to retain the protective ring 6. In addition, the guided piece 722 is actuable to slide up and down in the guiding slot 721 so as to permit the protective ring 6 retained by the guided pieces 722 of the guiding portions 72 to be moved up and down along with the substrate (W).

In some embodiments, the guided pieces 722 of the guiding portions 72 are respectively coupled to retain two portions 64 of the protective ring 6 that are diametrically opposite to each other. Thus, by synchronous sliding of the guided pieces 722 of the guiding portions 72 up and down, the protective ring 6 can be moved up and down along with the substrate (W) in the Z direction. In some embodiments, the two portions 64 are respectively coupled to the guided pieces 722 of the second portions 72 by a vacuum suction force. For example, the guided piece 722 may have a suction hole (not shown) and a pipe (not shown) fluidly connected between the suction hole and a pump (not shown). As such, after the pump is turn on to provide a negative pressure to the pipe, the suction holes on the guided pieces 722 of the guiding portion 72 may provide a vacuum suction force to retain the protective ring 6.

Figure 15:
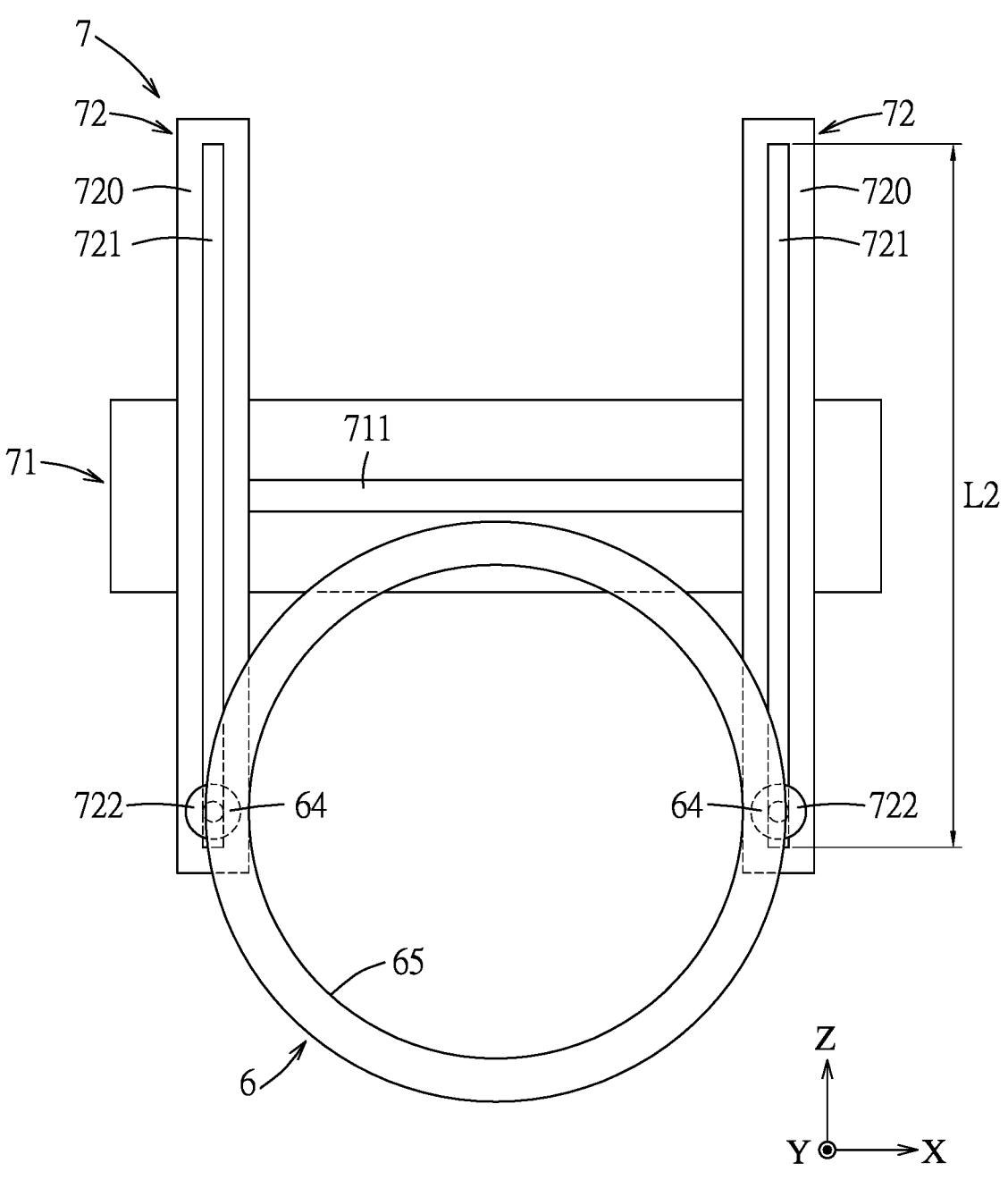
FIG. 15 is a view similar to that of FIG. 14, but illustrating the protective ring in a lower position in accordance with some embodiments.

In FIG. 14, the protective ring 6 is in an upper position where an inner periphery 65 of the protective ring 6 is located above the slit 711. FIG. 15 is a view similar to that of FIG. 14, but illustrating the protective ring 6 in a lower position in accordance with some embodiments. In the lower position, the inner periphery 65 of the protective ring 6 is located below the slit 711.

In some embodiments, the guiding slot 721 has a length L2 greater than a diameter of the substrate (W, see FIG. 13), so as to permit the protective ring 6 to be slidable between the upper position and the lower position. Therefore, during the implantation process, the protective ring 6 is able to be moved along with the substrate (W) so as to protect the robot fingers 4 of the robot 1.

In some embodiments, in order to release extra charges and to reduce occurrence of arcing, each of the robot fingers 4 is coated with an electrically conductive carbon-containing material, and is configured to be grounded. In some embodiments, each of the robot fingers 4 is made of a polymeric material (e.g., perfluoroalkoxy alkanes (PFA) or other suitable materials), and the electrically conductive carbon-containing material is graphite.

In some embodiments, the apparatus 100 further includes a transfer unit 8 (see FIGS. 18 to 20, and 22) configured for transferring and flipping the substrate (W) before the fingertips 43 of the robot fingers 4 retain the substrate (W), and the details of the transfer unit 8 will be described in the following paragraph.

In some alternative embodiments, the apparatus 100 and the robot 1 may further include additional features, and/or some features present in each of the apparatus 100 and the robot 1 may be modified, replaced, or eliminated without departure from the spirit and scope of the present disclosure.

Figure 16:
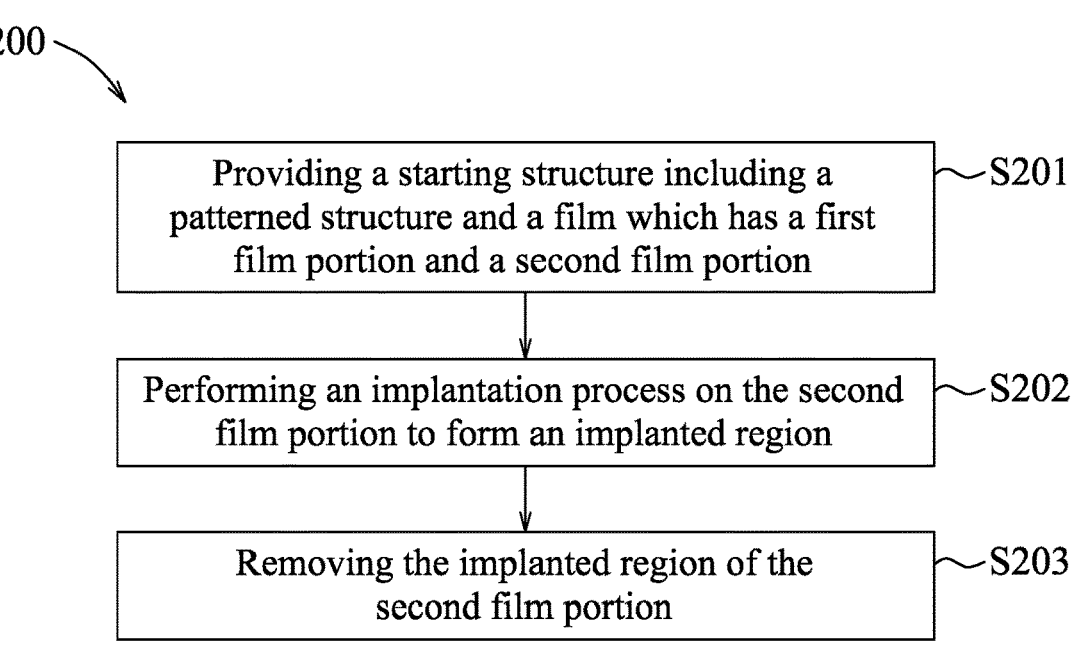
FIG. 16 is a flow diagram illustrating a method for manufacturing a semiconductor structure in accordance with some embodiments.

FIG. 16 is a flow diagram illustrating a method 200 for manufacturing a semiconductor structure (for example, but not limited to, a method for manufacturing a semiconductor structure 300C using the apparatus 100 shown in FIG. 12) in accordance with some embodiments. FIGS. 17 to 24 illustrate schematic views of intermediate stages of the method 200 in accordance with some embodiments. It is noted that similar numerals from the above-mentioned embodiments are used where appropriate, with some construction differences being indicated with different numerals.

Figure 17:
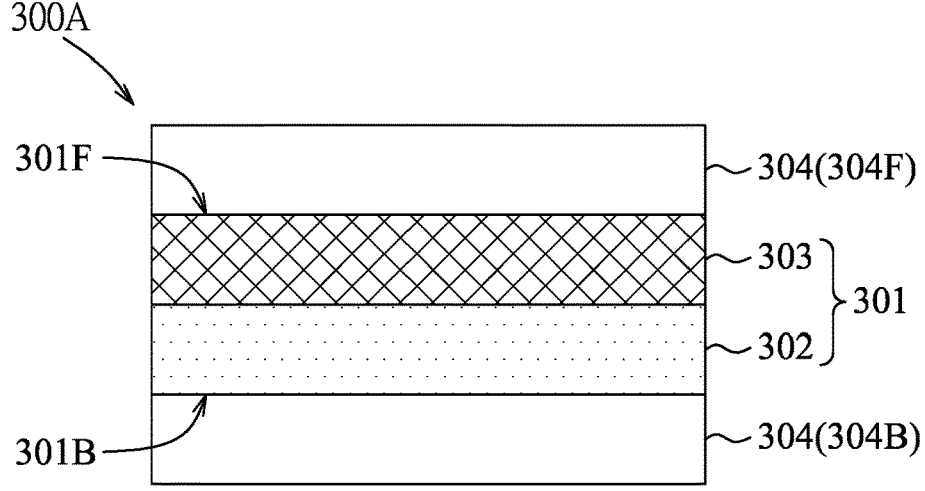
FIGS. 17 to 24 illustrate schematic views of intermediate stages of the method depicted in FIG. 16 in accordance with some embodiments.

Referring to FIG. 16 and the example illustrated in FIG. 17, the method 200 begins at step S201, where a starting structure 300A is provided.

The starting structure 300A includes a patterned structure 301 having a frontside surface 301F and a backside surface 301B opposite to the frontside surface 301F, and a film 304 disposed on both the frontside surface 301F and the backside surface 301B of the patterned structure 301.

In some embodiments, the patterned structure 301 includes a substrate portion 302 having the backside surface 301B of the patterned structure 301, and a patterned portion 303 disposed on the substrate portion 302 and having the frontside surface 301F of the patterned structure 301. In some embodiments, the substrate portion 302 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The material(s) for forming the substrate portion 302 may be doped with p-type impurities or n-type impurities, or undoped. In addition, the substrate portion 302 may be a bulk silicon substrate, a silicon-on-insulator (SOI) substrate, or a germanium-on-insulator (GOI) substrate. Other suitable materials for the substrate portion 302 are within the contemplated scope of the present disclosure. In some embodiments, the patterned portion 303 may include an integrated circuit or a semi-finished product to be formed into the integrated circuit. In some embodiments, the integrated circuit may include active devices (for example, transistors, or the like), and passive devices (for example, capacitors, resistors, or the like). Examples for the active devices may include bipolar junction transistors (BJTs), fin-type field-effect transistors (FinFET), and multi-gate FETs (for example, but not limited to, a gate-all-around FET (GAAFET), multi-bridge channel FETs (MBCFET), fork-sheet FETs), but is not limited thereto. Other devices suitable for integrated in the integrated circuit are within the contemplated scope of the present disclosure.

In some embodiments, the film 304 may include a dielectric material, such as silicon oxide, silicon nitride, silicon carbide, silicon oxynitride, silicon carbonitride, silicon oxycarbide, silicon oxycarbonitride, other suitable materials, or combinations thereof. In some embodiments, the material for forming the film 304 may be represented by a chemical formula of $Si_aO_bC_cN_{(1-a-b-c)}$, where "a" has a value ranging from about 0.27 to 0.5, "b" has a value ranging from about 0.04 to 0.27, "c" has a value ranging from about 0.06 to 0.52, and a sum of "a", "b", and "c" is less than 1. In some embodiments, the film 304 may have a film density ranging from about 2.5 $g/cm^3$ to about 2.8 $g/cm^3$, but is not limited thereto. Other film materials suitable for forming on the patterned structure 301 are within the contemplated scope of the present disclosure.

In some embodiments, the starting structure 300A may be prepared by forming the film 304 on the patterned structure 301 using chemical vapor deposition (CVD) technique in a CVD furnace. In the CVD furnace, the frontside surface 301F and the backside surface 301B of the patterned structure 301 are exposed to a precursor gas used in the CVD process, and thus, the film 304 has a first film portion 304F formed on the frontside surface 301F, and a second film portion 304B formed on the backside surface 301B of the patterned structure 301. In practical, the first film portion 304F is formed on the patterned portion 302 for forming the integrated circuit, and the second film portion 304B is inevitably formed on the backside surface 301B of the patterned structure 301 according to the characteristics of the deposition process.

Figure 24:
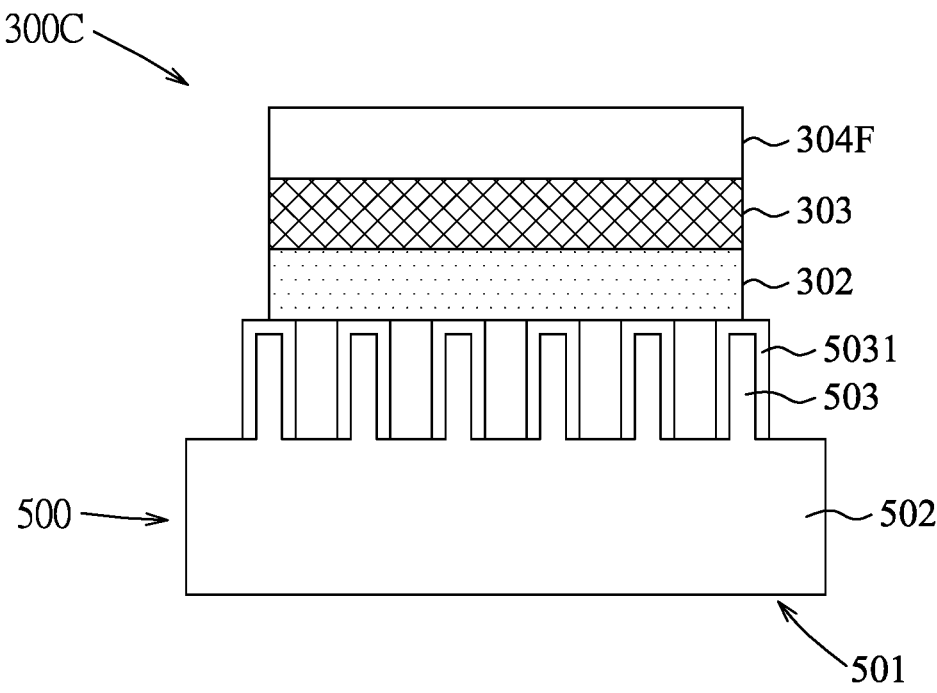

In a treatment process for further processing the first film portion 304F, the starting structure 300A may be disposed on a substrate retainer (for example, but not limited to, a substrate retainer 501 shown in FIG. 24). In this case, the second film portion 304B is in contact with the substrate retainer. When the film 304 has a hardness greater than that of a material of the substrate retainer (e.g., the film 304 has a hardness greater than a hardness (about 18 GPa) of a coated material (chromium nitride) of the substrate retainer used in a lithography apparatus), the second film portion 304B may adversely damage the substrate retainer, thereby causing system errors (e.g., overlay error) or generation of defects (e.g., defocus) when a wafer or a substrate is disposed on the damaged substrate retainer. To prevent damage of the substrate retainer, before the treatment process, the second film portion 304B is removed using the following steps S202 and S203.

Referring to FIG. 16 and the examples illustrated in FIGS. 18 to 22, the method 200 begins at step S202, where an implantation process is performed on the second film portion 304B such that the second film portion 304B has an implanted region 304I including implanted elements.

In some embodiments, step S202 may include sub-steps of S2021 to S2023.

Figure 18:
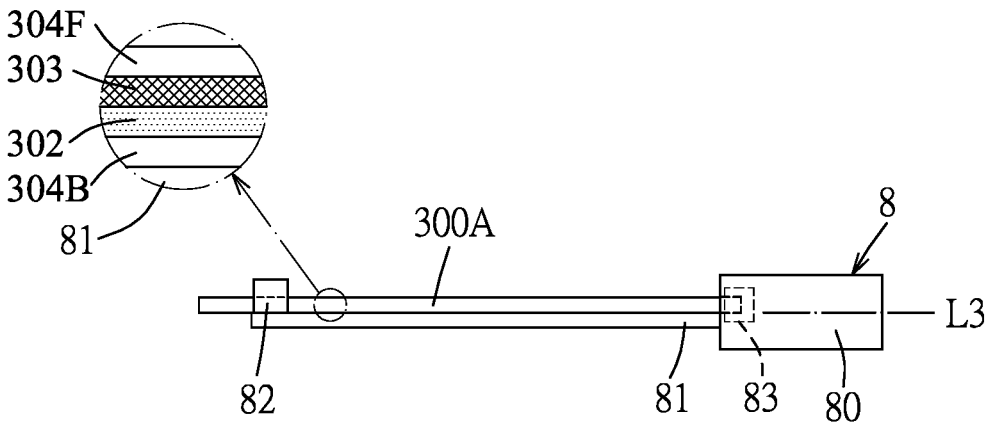
Figure 19:
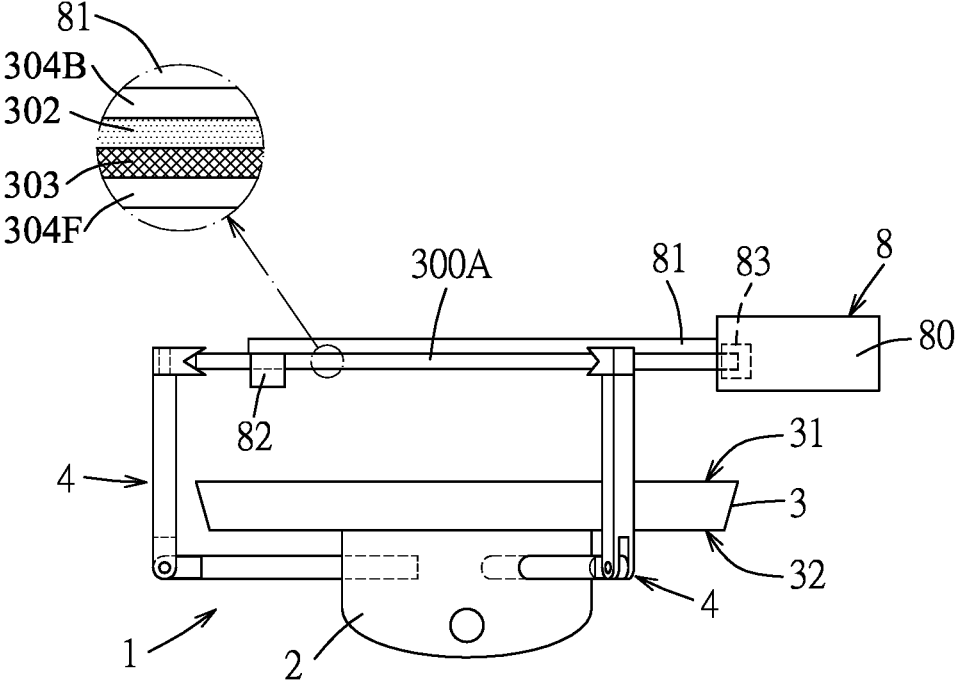
Figure 20:
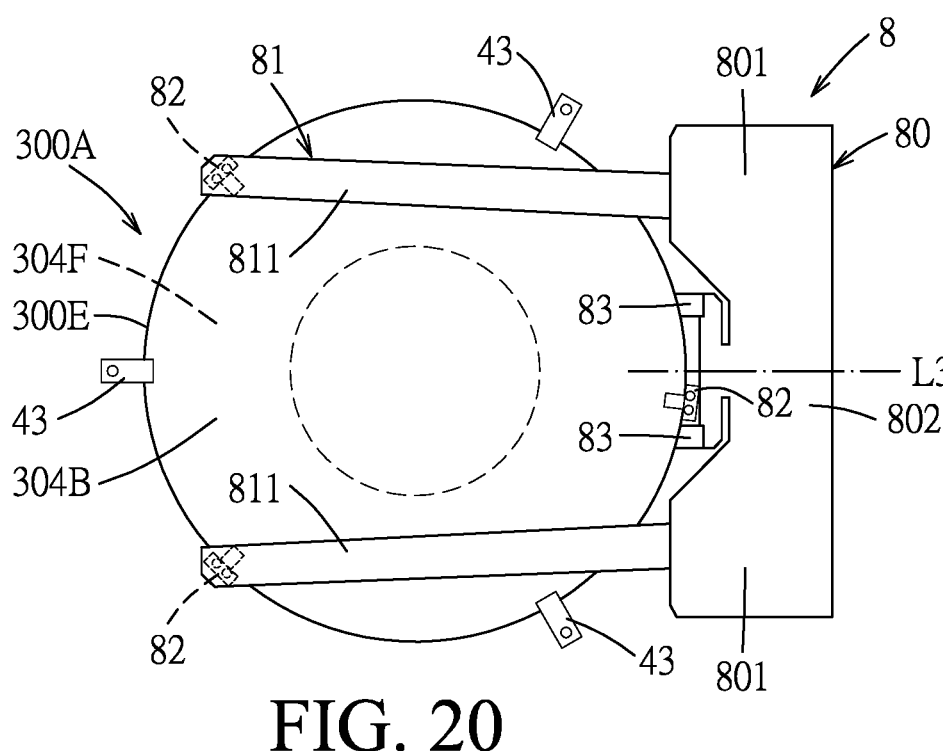

In sub-step S2021, the starting structure 300A is displaced by the transfer unit 8 toward the robot 1, as shown in FIGS. 18 and 19. FIG. 18 is a schematic side view illustrating the starting structure 300A to be retained by the transfer unit 8 in accordance with some embodiment, in which a first portion of the starting structure 300A is fragmentarily enlarged. FIG. 19 is a schematic side view illustrating the starting structure 300A retained by the transfer unit 8 to be transferred to the robot 1 in accordance with some embodiments, in which a second portion of the starting structure 300A is fragmentarily enlarged and a portion of the robot 1 is omitted. FIG. 20 is a top view of the starting structure 300A retained by the transfer unit 8 as viewed from the side view shown in FIG. 19 in accordance with some embodiments. In some embodiments, the transfer unit 8 includes a base 80, a support element 81, and at least three retaining pieces 82 (see also FIG. 20). The support element 81 includes two support arms 811 each of which has a connected end and a free end opposite to the connected end. The connected ends of the support arms 811 are respectively connected to two lateral portions 801 of the base 80. Two of the retaining pieces 82 are respectively mounted to the free ends of the support arms 811, and the remaining one of the retaining pieces 82 is mounted to a middle portion 802 between the lateral portions 801 of the base 80. The retaining pieces 82 are actuable to switch between an engaging position, where the retaining pieces 82 are in retaining engagement with an outer periphery 300E of the starting structure 300A, and a release position, where the starting structure 300A is released from the retaining pieces 82. The base 80 is actuable to move toward or away from the robot 1 so as to permit a structure (for example, the starting structure 300A), which is retained by the retaining pieces 82, to be transferred toward or away from the robot 1. In addition, the base 80 is also actuable to rotate about a central axis (for example, but not limited to, an axis L3 shown in FIGS. 18 and 20) passing through the middle portion 802 of the base 80 so as to permit the structure retained by the retaining pieces 82 to be rotated along with the base 80. In some embodiments, during displacement of the starting structure 300A, the support arms 811 are in direct contact with the second film portion 304B, and the retaining pieces 82 are in free contact with a major portion of the starting structure 300A in which the integrated circuits are formed, and thus the first film portion 304F and the patterned portion 303 at the major portion of the starting structure 300A may be prevented from being damaged or contaminated. In some embodiments, the transfer unit 8 further includes at least one abutment piece 83 which is disposed on the middle portion 802 of the base 80. Once the retaining pieces 82 are switched to the engaging position to retain the starting structure 300A, the outer periphery 300E of starting structure 300A is brought into abutting engagement with the abutment piece 83. The number of the retaining pieces 82, the number of the abutment piece 83, and the configuration of the support element 81 may be varied as long as the elements in the transfer unit 8 do not interfere the operation of the robot fingers 4 of the robot 1 (see FIGS. 19 and 20).

In some embodiments, after sub-step S2021, by actuating the base 80 to rotate, for example, but not limited to, by about 180 degrees, the starting structure 300A retained by the retaining pieces 82 may be flipped upside down (i.e., the second film portion 304B is faced upward), as shown in FIG. 19.

In sub-step S2022, as shown in FIG. 19, the robot fingers 4 are actuated to the retaining position such that the starting structure 300A is retained on the first side 31 of the platform 3 by the fingertips 43 of the robot fingers 4 and is spaced apart from the platform 3, and such that the patterned portion 303 and the substrate portion 302 are respectively proximate to and distal from the platform 3.

In some embodiments, after the starting structure 300A is retained on the first side 31 of the platform 3 by the fingertips 43 of the robot fingers 4, (i) the retaining pieces 82 are actuated to switch to the release position, (ii) the base 80 is actuated to move away from the robot 1, and (iii) the support frame 2 is actuated to move to the second position (see FIGS. 2 and 10). Therefore, before sub-step S2023, the starting structure 300A is merely retained by the fingertips 43 of the robot fingers 4 (see FIG. 21).

Figure 21:
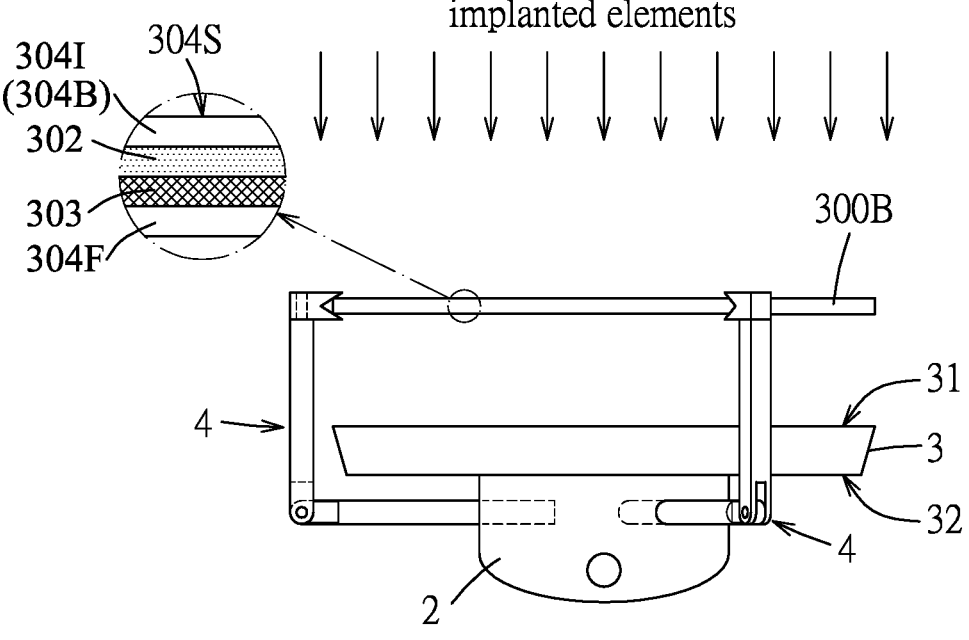

In sub-step S2023, the implanted elements are implanted into the second film portion 304B to form the implanted region 304I in the second film portion 304B, as shown in FIG. 21. After sub-step S2023, the starting structure 300A shown in FIG. 19 is formed into an implanted structure 300B. FIG. 21 is a schematic side view illustrating formation of the implanted region 304I in accordance with some embodiments, in which a portion of the implanted structure 300B is fragmentarily enlarged. The implanted region 304I may have a relatively loose microstructure after being bombarded by the implanted elements, and thus may be effectively removed by a subsequent etching process. In some embodiments, the implanted elements include carbon (C), nitrogen (N), silicon (Si), phosphorous (P), germanium (Ge), arsenic (As), indium (In), or combinations thereof. Other suitable implanted elements are within the contemplated scope of the present disclosure. In some embodiments, the properties (e.g., thickness, film density, etc.) of the implanted region 304I may be controlled by adjusting process parameters (for example, but not limited to, energy, dosage, etc.) of the implantation process. For example, the thickness of the implanted region 304I may be controlled by adjusting an energy for implanting the implanted elements. The higher the implant energy is, the greater the thickness of the implanted region 304I is. The film density of the implanted region 304I may be controlled by adjusting a dosage for implanting the implanted elements. The higher the implant dosage is, the lower the density of the implanted region 304I is, thereby increasing a removal rate of the implanted region 304I during a subsequent etching process. In some embodiments, an energy for implanting the implanted elements ranges from 0.1 keV to 10 keV. In some embodiments, a dosage for implanting the implanted elements ranges from 5E20 atoms/cm$^3$ to 5E22 atoms/cm$^3$. In some embodiments, although, an angle of incidence at which the implanted elements are implanted is about 0 degree as shown in FIG. 21, the implanted elements may be implanted into the second film portion 304B at an angle of incidence ranging from about 0 degree to about 30 degree according to application requirements. In some embodiments, as shown in FIG. 21, in order to effectively remove the entire second film portion 304B from the substrate portion 302, the implanted region 304I may have a thickness substantially equal to a total thickness of the second film portion 304B by controlling an energy for implanting the implanted elements.

In sub-step 2024, (i) the base 80 is actuated to move toward the robot 1, (ii) the retaining pieces 82 are actuated to switch to the engaging position, and (iii) the robot fingers 4 are actuated to move away from the retaining position so as to permit the implanted structure 300B to be moved away from the robot 1 by the transfer unit 8. Afterwards, the implanted structure 300B may be transferred to another process equipment for the next process step.

Figures 22, 23:
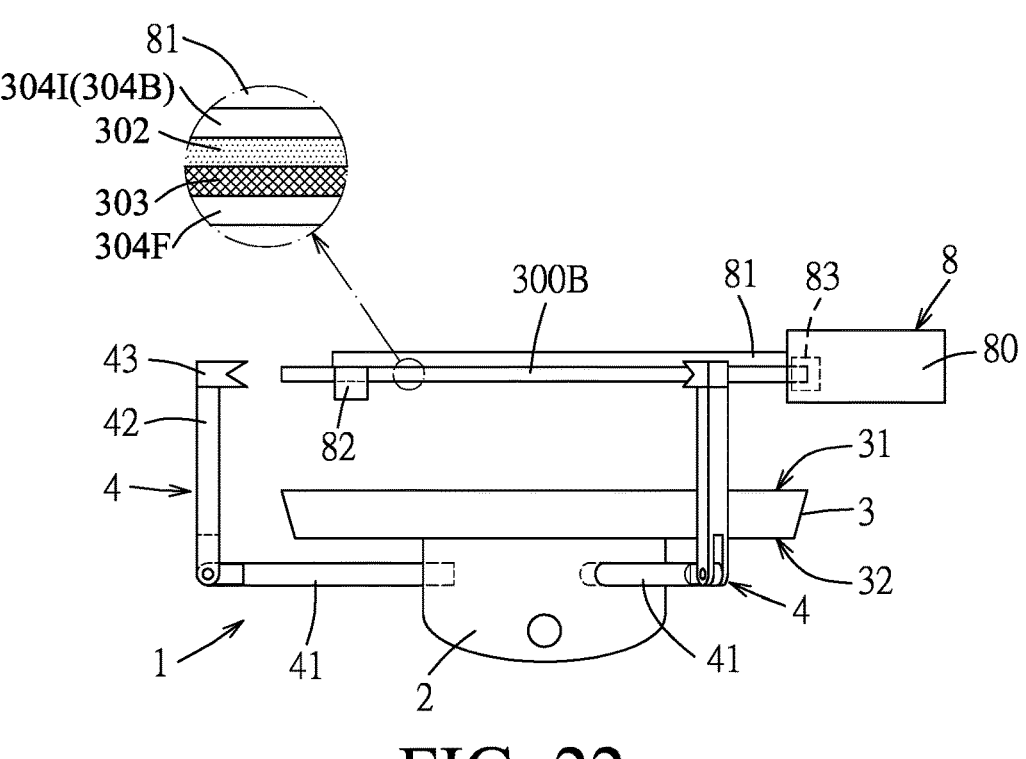

Referring to FIG. 16 and the example illustrated in FIG. 23, the method 200 begins at step S203, where the implanted structure 300B is subjected to a wet etching process in a wet etching apparatus 400 to remove the implanted region 304I of the second film portion 304B from the substrate portion 302, thereby obtaining the semiconductor structure 300C (see FIG. 24). FIG. 23 is a schematic view illustrating the implanted structure 300B to be treated in the wet etching apparatus 400 in accordance with some embodiments.

In some embodiments, the wet etching apparatus 400 includes a main body 401, at least three pins 403 connected to the main body 401 for retaining the implanted structure 300B, and a nozzle 404 in position above the main body 401 for supplying a wet etchant solution.

In some embodiments, as shown in FIG. 23, an edge portion of the implanted structure 300B is retained by the pins 403 so as to be spaced apart from the main body 401 such that the implanted region 304I and the first film portion 304F are respectively proximate to and distal from the nozzle 404. In some embodiments, the main body 401 may be formed with a conduit 402 configured for blowing the first film portion 304F using a gas (for example, but not limited to, nitrogen) so as to prevent access of the wet etchant solution to the first film portion 304F.

In some embodiments, the removal of the implanted region 304I includes applying the wet etchant solution to etch away the implanted region 304I. In some embodiments, the wet etchant solution includes diluted hydrogen fluoride (DHF) or phosphoric acid ($H_3PO_4$). In some embodiments, when the wet etchant solution is a $H_3PO_4$ solution, the temperature of the $H_3PO_4$ solution may range from about 80° C. to about 200° C. In some embodiments, a flow rate of the H3PO4 solution may range from about 0.1 L/min to about 1.5 L/min. In some embodiments, a volume percent of $H_3PO_4$ may range from 50% to 95%. In some embodiments, when the wet etchant solution is a DHF solution, the temperature of the DHF solution is ambient temperature. In some embodiments, a volumetric ratio of HF to water may range from 1:70 to 1:130. Other wet etchant solutions suitable for removing the implanted region 304I are within the contemplated scope of the present disclosure.

FIG. 24 is a schematic view illustrating the semiconductor structure 300C on a lithography apparatus 500 in accordance with some embodiments. After step S203, the semiconductor structure 300C in the wet etchant apparatus 400 may be transferred to another process equipment (e.g., the lithography apparatus 500) for the next process step. In some embodiments, as shown in FIG. 24, the lithography apparatus 500 may include a substrate retainer 501 which has a wafer table 502 and a plurality of bars (or burls) 503 arranged on the wafer table 502. In some embodiments, each of the bars 503 is coated with a hard coating layer 5031 which is made of chromium nitride having a hardness of about 18 GPa. Since the second film portion 304B which is originally formed on the substrate portion 302 is removed in step S203, the semiconductor structure 300C is able to be placed on the substrate retainer 501 with the substrate portion 302 in direct contact with the bars 503. It is worth noting that since the materials used to form the substrate portion 302 generally have a hardness less than the hardness (i.e., about 18 GPa) of the hard coating layer 5031, the bars 503 of the substrate retainer 501 are less likely to be damaged or consumed during placement and/or removal of the semiconductor structure 300C.

In some embodiments, some steps in the method 200 may be modified, replaced, or eliminated without departure from the spirit and scope of the present disclosure.

Figure 25:
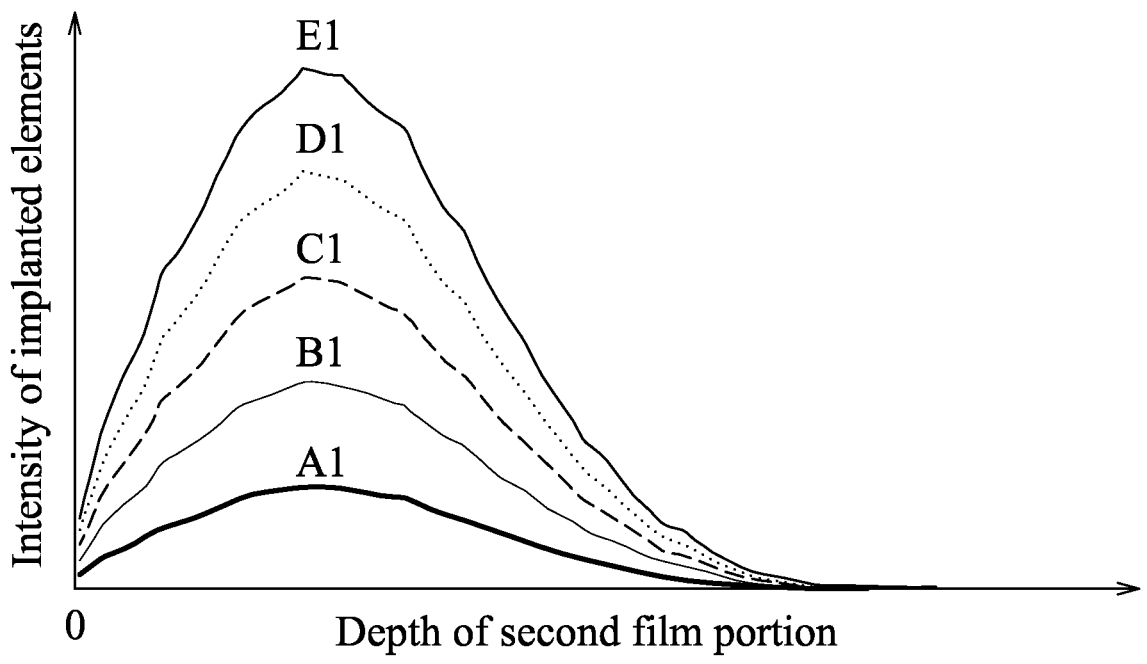
FIG. 25 is a graph of a simulated implantation result illustrating variation in an intensity of implanted elements over depth of a second film portion for Samples A1 to E1 in accordance with some embodiments.
Figure 26:
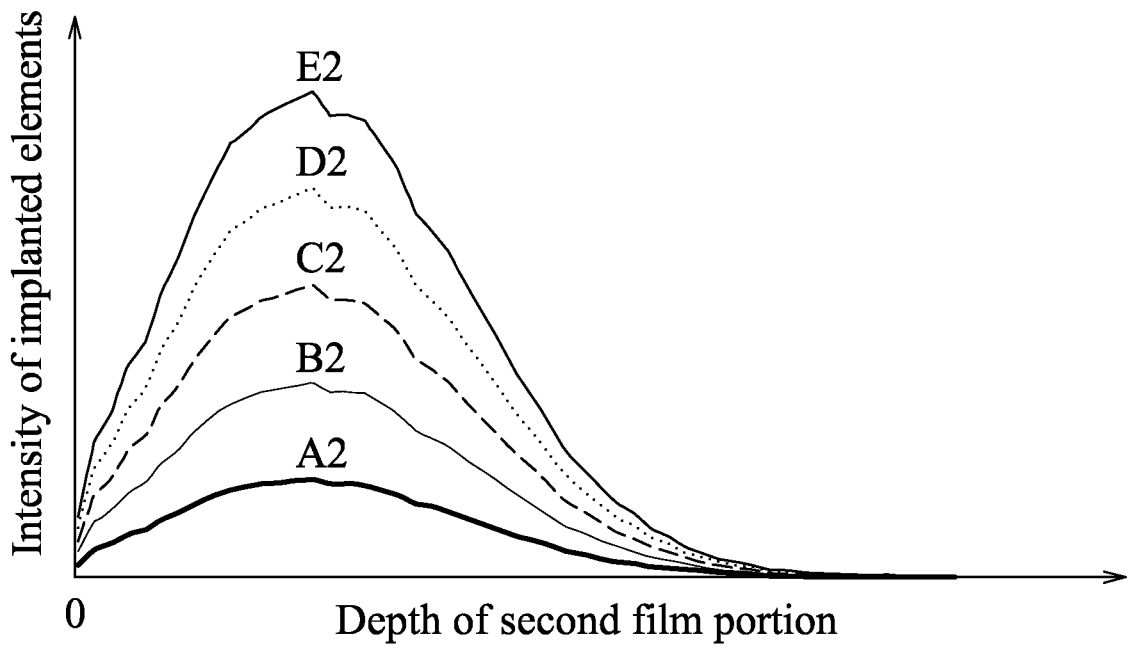
FIG. 26 is a graph of a simulated implantation result illustrating variation in an intensity of the implanted elements over depth of the second film portion for Samples A2 to E2 in accordance with some embodiments.

FIG. 25 is a graph of a simulated implantation result illustrating variation in an intensity of the implanted elements over depth of the second film portion 304B for Samples A1 to E1 in accordance with some embodiments. FIG. 26 is a graph of a simulated implantation result illustrating variation in an intensity of the implanted elements over depth of the second film portion 304B for Samples A2 to E2 in accordance with some embodiments. Samples A1 to E1 each has a structure similar to that of the implanted structure 300B shown in FIG. 21, and the second film portions 304B of Samples A1 to E1 are made of a first dielectric material having a chemical formula of $Si_aO_bC_cN_{(1-a-b-c)}$ as described in the preceding paragraph. Samples A2 to E2 each has a structure similar to that of the implanted structure 300B shown in FIG. 21, and the second film portions 304B of Samples A2 to E2 are made of a second dielectric material having a chemical formula of $Si_aO_bC_cN_{(1-a-b-c)}$ as described in the preceding paragraph. The values of a, b, c in the first dielectric material are different from those in the second dielectric material. The carbon content of the first dielectric material is higher than that of the second dielectric material. Samples A1, B1, C1, D1 and E1 are respectively subjected to an implantation process for one, two, three, four, and five implantation cycles so that the implanted region 304I is formed in each of Samples A1, B1, C1, D1 and E1. In each of the implantation cycles, the second film portion 304B is entirely scanned once by the ion beam (I, see also FIG. 12) using the same energy and with the same dosage, and the implanted elements for implanting the second film portion 304B include nitrogen. Likewise, Samples A2 to E2 are subjected to the same implantation process conducted in manners similar to those of Samples A1 to E1.

For each of Samples A1 to E1 and A2 to E2, the intensity of the implanted elements increases from an outer surface 304S (see FIG. 21) of the second film portion 304B (i.e. a depth of about zero) to reach a maximum value at a first depth $(D_{max})$, and decreases to near zero at a second depth $(D_0)$. The intensity of the implanted elements is positively correlated to a doping concentration of the implanted elements in the second film portion 304B. The outer surface 304S of the second film portion 304B may be referred to as an upper boundary of the implanted region 304I, and the second depth $(D_0)$ may be referred to as a lower boundary of the implanted region 304I. A difference between the upper boundary and the lower boundary of the implanted region 304I may be referred to as a thickness (T) of the implanted region 304I, and a symbol "T" shown in the vertical axis in each of FIGS. 27 to 30 represents the thickness (T) of the implanted region 304I.

As shown in FIG. 25, Samples A1 to E1 have values of the first depth $(D_{max})$ similar to one another, and have values of the second depth $(D_0)$ similar to one another. Notably, the intensity of the implanted elements increases with the numbers of the implantation cycles. In other words, the energy for implanting the implanted elements may determine a first depth $(D_{max})$ at which intensity of the implanting elements reaches a maximum value, and a second depth $(D_0)$ at which intensity of the implanting elements reaches about zero. In addition, the numbers of the implanted cycles may determine an intensity (or a concentration) of the implanted elements in the implanted region 304I.

As shown in FIG. 26, a variation of an intensity of the implanted elements over depth of the second film portion 304B for Samples A2 to E2 has a manner similar to that for Samples A1 to E1. The first depth $(D_{max})$ of Samples A2 to E2 is slightly greater than that of Samples A1 to E1 due to the difference between the material of the second film portion 304B in Samples A2 to E2 and the material of the second film portion 304B in Samples A1 to E1.

Figure 27:
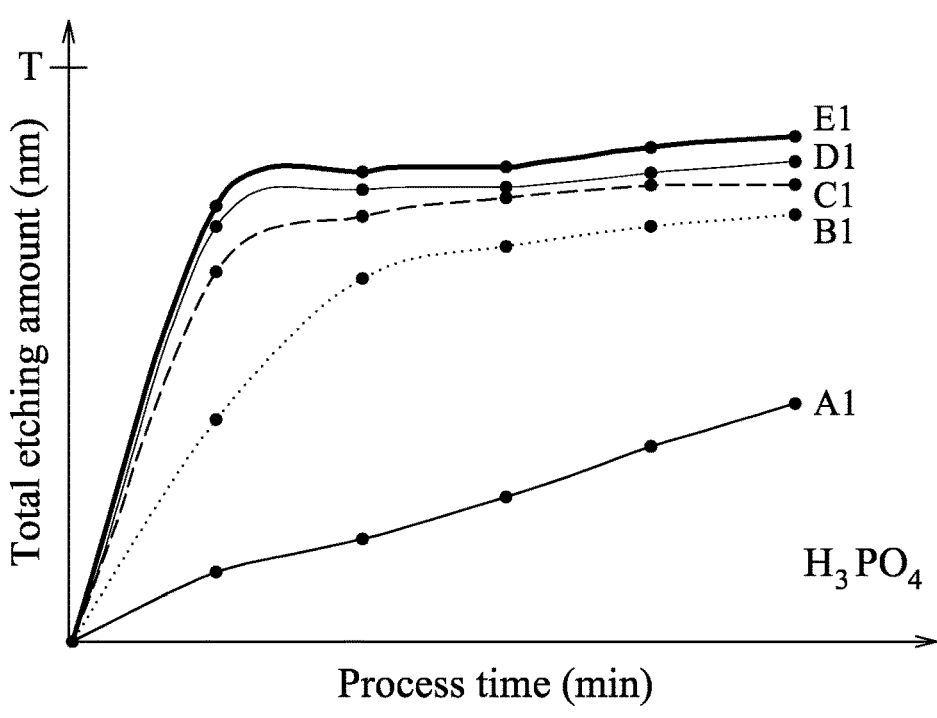
FIG. 27 is a graph illustrating variation of a total etching amount of an implanted region over process time for Samples A1 to E1 in the case that a wet etchant solution used in a wet etching process includes use of phosphoric acid ($H_3PO_4$) in accordance with some embodiments.
Figure 28:
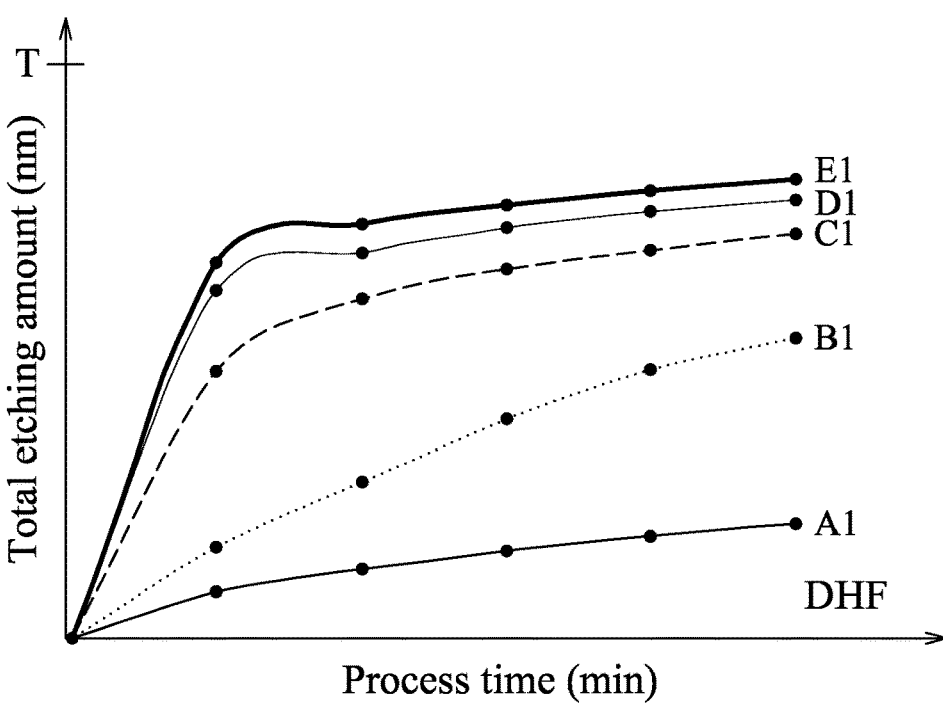
FIG. 28 is a graph similar to that of FIG. 27 but the wet etchant solution used in the wet etching process includes use of diluted hydrogen fluoride (DHF) in accordance with some embodiments.
Figure 29:
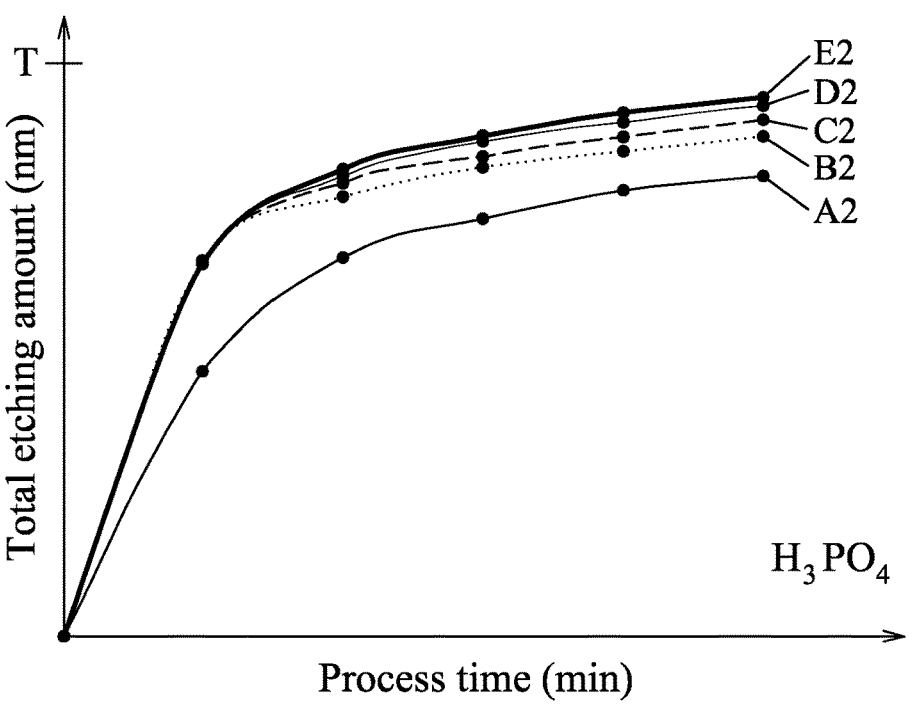
FIG. 29 is a graph similar to that of FIG. 27 but illustrating variation of a total etching amount of the implanted region over process time for Samples A2 to E2.
Figure 30:
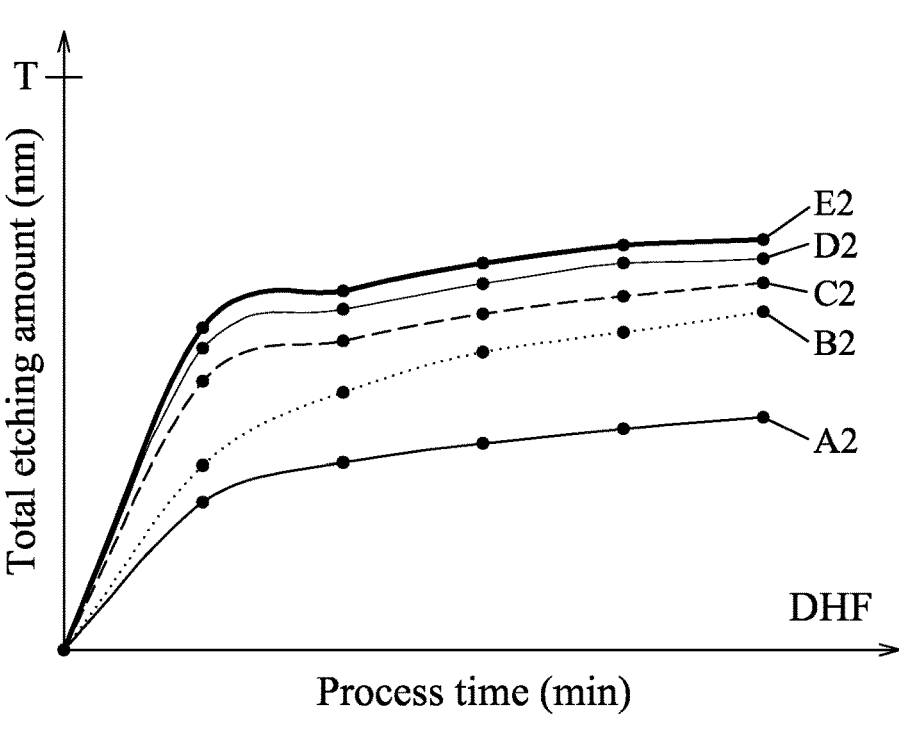
FIG. 30 is a graph similar to that of FIG. 28 but illustrating variation of a total etching amount of the implanted region over process time for Samples A2 to E2.

FIG. 27 is a graph illustrating variation of a total etching amount of the implanted region 304I over process time for Samples A1 to E1 in the case that a wet etchant solution used in a wet etching process includes use of $H_3PO_4$ in accordance with some embodiments. FIG. 28 is a graph similar to that of FIG. 27 but the wet etchant solution used in the wet etching process includes use of DHF in accordance with some embodiments. FIG. 29 is a graph similar to that of FIG. 27 but illustrating variation of a total etching amount of the implanted region 304I over process time for Samples A2 to E2. FIG. 30 is a graph similar to that of FIG. 28 but illustrating variation of a total etching amount of the implanted region 304I over process time for Samples A2 to E2.

As shown in FIGS. 27 and 29, the implanted region 304I of each of Samples A1 to E1 and A2 to E2 is removed by a hot $H_3PO_4$ solution. As shown in FIGS. 28 and 30, the implanted region 304I of each of Samples A1 to E1 and A2 to E2 is removed by DHF solution at ambient temperature.

As shown in each of FIGS. 27 to 30, a remaining thickness of the second film portion 304B is measured at a predetermined process time, and a difference between the remaining thickness and an original thickness of the second film portion 304B is calculated as the total etching amount shown on the vertical axis. In addition, a symbol "T" shown on the vertical axis represents the thickness of the implanted region 304I for each of Samples A1 to E1 and A2 to E2.

As shown in each of FIGS. 27 to 30, it is worth noting that regardless of whether the wet etchant includes the $H_3PO_4$ solution or the DHF solution, Sample E1 (or Sample E2) obtained by a relatively high number of the implantation cycles reaches a higher etching amount of the implanted region 304I than that of each of Samples A1 to D1 (or Samples A2 to D2) within a relatively shorter process time. Furthermore, an etching rate (i.e., a slope of a curve) is relatively high at the beginning of the wet etching process, and then becomes gradually lower when the total etching amount of the second film portion 304B approaches the thickness of the implanted region 304I (i.e., the symbol "T" shown in the vertical axis in each of FIGS. 27 to 30). In addition, when the first dielectric material doped with nitrogen serves as the material of the implanted region 304I, the implanted region 304I, when being etched by the $H_3PO_4$ solution (see FIG. 27), may have a greater etching rate in comparison with the case that the implanted region 304I is etched by the DHF solution (see FIG. 28). Similarly, when the second dielectric material doped with nitrogen serves as the material of the implanted region 304I, the implanted region 304I, when being etched by the $H_3PO_4$ solution (see FIG. 29), may have a greater etching rate in comparison with the case that the implanted region 304I is etched by the DHF solution (see FIG. 30).

For Samples A1 to E1, once the second film portion 304B is implanted by nitrogen to have the implanted region 304I, in the case shown in FIG. 27, the implanted region 304I may be removed by the H$_3$PO$_4$ solution at an initial etching rate ranging from about 1 nm/min to about 11 nm/min, whereas in the other case shown in FIG. 28, the implanted region 304I may be removed by the DHF solution at an initial etching rate ranging from about 0.3 nm/min to about 7 nm/min. For Samples A2 to E2, once the second film portion 304B is implanted by nitrogen to have the implanted region 304I, in the case shown in FIG. 29, the implanted region 304I may be removed by the H$_3$PO$_4$ solution at an initial etching rate ranging from about 2 nm/min to about 10 nm/min, whereas in the other case shown in FIG. 30, the implanted region 304I may be removed by the DHF solution at an initial etching rate ranging from about 0.8 nm/min to about 6 nm/min. It is noted that process parameters of the implantation process (e.g., species selection of the implanted elements, an implantation energy, an implantation dosage, and so on) and process parameters of the wet etching process (e.g., material selection of the wet etching solution, concentration(s) of etchant(s), flow rate(s) of etchant(s), concentration ratio of etchant(s), etchant temperature, and so on) may be further adjusted to achieve a much greater etching rate or a much more etching amount.

With the provision of the robot fingers in the robot of this disclosure, when a wafer is retained by the robot fingers, a backside structure on the wafer may be processed without damaging or contaminating a frontside structure on the wafer. In addition, during processing the backside structure using an implantation process, the protective ring can be actuated to move synchronously with the wafer so as to prevent the robot fingers from being damaged by the ion beams generated in the implantation process. In comparison with the backside structure without being treated by the implantation process, the backside structure treated by the implantation process can be removed more easily by the wet etching process using the wet etchant solution having a relatively low concentration for a relatively short process time. Thus, the wet etching process of the disclosure is more environmentally friendly, and the backside structure can be removed more efficiently using the implantation process and the wet etching process. Furthermore, a yield rate of the integrated circuit to be formed in the frontside structure on the wafer can be improved since the frontside structure on the wafer is less likely to be damaged by the implantation process and the wet etching process. Therefore, the robot, the apparatus including the robot, and the method for manufacturing semiconductor structure of this disclosure are useful for achieving high product yield, while incurring low cost and being environmentally friendly.

In accordance with some embodiments of the present disclosure, an apparatus includes a supporting frame, a platform supported by the supporting frame and having a first side and a second side opposite to the first side, and at least three robot fingers which are mounted to the supporting frame, and which are angularly displaced from each other. Each of the robot fingers has a fingertip configured to retain a substrate on the first side of the platform such that the substrate is spaced apart from the platform.

In accordance with some embodiments of the present disclosure, the platform is an electrostatic chuck.

In accordance with some embodiments of the present disclosure, the robot fingers are operable to move among a lay-down position, where the robot fingers are disposed at the second side of the platform, a lift-up position, where the fingertips of the robot fingers are disposed at the first side of the platform and are in free contact with the substrate, and a retaining position, where the fingertips of the robot fingers cooperatively retain the substrate.

In accordance with some embodiments of the present disclosure, each of the robot fingers further includes a first segment mounted to the supporting frame, and a second segment connected between the first segment and the fingertip to form a first angle with the first segment, and to form a second angle with the fingertip.

In accordance with some embodiments of the present disclosure, the first segment is elongated along a first axis and is actuable to rotate about the first axis relative to the supporting frame such that by actuating the first segments of the robot fingers to rotate relative to the supporting frame, the fingertips of the robot fingers are permitted to be moved between the first and second sides of the supporting frame.

In accordance with some embodiments of the present disclosure, the first segment is elongated along a first axis and is actuable to slide along the first axis relative to the supporting frame between an extended position and a retracted position. When the robot fingers are in each of the lay-down position and the lift-up position, the first segment is in the extended position. When the fingertips of the robot fingers are at the first side of the supporting frame, by actuating the first segments of the robot fingers to slide from the extended position toward the retracted position, the robot fingers are moved from the lift-up position to the retaining position.

In accordance with some embodiments of the present disclosure, the first segment is elongated along a first axis and is actuable to slide along the first axis relative to the supporting frame between an extended position and a retracted position. The second segment is actuable to rotate relative to the first segment so as to permit the robot fingers to be further operable to move between the lay-down position and a collapsed position. When the robot fingers are in each of the lay-down position and the lift-up position, the first segment is in the extended position. When the robot fingers are in the collapsed position, the first segment is in the retracted position. The fingertip is proximate to the supporting frame when the robot fingers are in the collapsed position and is distal from the supporting frame when the robot fingers are in the lay-down position, such that in response to movement of the robot fingers from the collapsed position to the lay-down position, the first angle between the first and second segments is increased.

In accordance with some embodiments of the present disclosure, the second segment is elongated along a second axis, and the fingertip is actuable to rotate relative to the second segment about the second axis so as to permit the robot fingers to be displaced between the retaining position and the lift-up position.

In accordance with some embodiments of the present disclosure, an apparatus includes a robot, an ion-beam generator and a protective ring. The robot includes a supporting frame, a platform supported by the supporting frame and having a first side and a second side opposite to the first side, and at least three robot fingers which are mounted to the supporting frame, and which are angularly displaced from each other. Each of the robot fingers has a fingertip configured to retain a substrate on the first side of the platform such that the substrate is spaced apart from the platform. The ion-beam generator is disposed to apply an ion beam to the substrate. The protective ring is disposed between the ion beam generator and the robot such that when the ion beam is applied on the substrate, the robot fingers are shielded by the protective ring.

In accordance with some embodiments of the present disclosure, the protective ring is made of an electrically conductive carbon-containing material.

In accordance with some embodiments of the present disclosure, the protective ring is made of graphite.

In accordance with some embodiments of the present disclosure, the protective ring has an inner radius which is not less than a radius of the substrate by 0.5 mm, and which is not greater than the radius of the substrate by 0.5 mm.

In accordance with some embodiments of the present disclosure, the protective ring further has an outer radius, and a difference between the inner and outer radii ranges from 10 mm to 30 mm.

In accordance with some embodiments of the present disclosure, each of the robot fingers is coated with an electrically conductive carbon-containing material.

In accordance with some embodiments of the present disclosure, each of the robot fingers is made of perfluoro-alkoxy alkanes (PFA), and the electrically conductive carbon-containing material is graphite.

In accordance with some embodiments of the present disclosure, the apparatus further includes a transfer unit configured for transferring and flipping the substrate before the fingertips of the robot fingers retain the substrate.

In accordance with some embodiments of the present disclosure, a method for manufacturing a semiconductor structure includes: (i) providing a starting structure including a patterned structure which has a frontside surface and a backside surface opposite to the frontside surface, and which includes a substrate portion having the backside surface, and a patterned portion disposed on the substrate portion and having the frontside surface, and a film which has a first film portion disposed the frontside surface and a second film portion disposed on the backside surface; (ii) performing an implantation process on the second film portion such that the second film portion has an implanted region including implanted elements; and (iii) removing the implanted region of the second film portion.

In accordance with some embodiments of the present disclosure, performing the implantation process includes: (i) displacing the starting structure toward a robot, the robot including a supporting frame, a platform which is supported by the supporting frame and which has a first side and a second side opposite to the first side, and at least three robot fingers which are mounted to the supporting frame, and which are angularly displaced from each other, each of the robot fingers having a fingertip; (ii) actuating the robot fingers such that the starting structure is retained on the first side of the platform by the fingertips of the robot fingers and is spaced apart from the platform, and such that the patterned portion and the substrate portion are respectively proximate to and distal from the platform; (iii) implanting the implanted elements into the second portion of the film to form the implanted region; and (iv) further actuating the robot fingers so as to permit the starting structure to be detached from the fingertips of the robot fingers.

In accordance with some embodiments of the present disclosure, the implanted elements include carbon (C), nitrogen (N), silicon (Si), phosphorous (P), germanium (Ge), arsenic (As), indium (In), or combinations thereof.

In accordance with some embodiments of the present disclosure, the removal of the implanted region includes applying a wet etchant solution to etch away the implanted region, the wet etching solution including diluted hydrogen fluoride (DHF) or phosphoric acid ($H_3PO_4$).

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
a robot including
a supporting frame;
a platform supported by the supporting frame and having a first side and a second side opposite to the first side; and
robot fingers which are mounted to the supporting frame, and which are angularly displaced from each other, each of the robot fingers having a fingertip configured to retain a substrate on the first side of the platform such that the substrate is spaced apart from the platform;
an ion beam extractor which is configured for controlling a beam size of an ion beam incident on the substrate, and which is spaced apart from the robot along a first direction, the ion beam extractor including
a main portion formed with a slit which is elongated in a second direction different from the first direction, and
two guiding portions which are connected to the main portion and are located at two opposite sides of the slit in the second direction, each of the two guiding portions having
a guide rail formed with a guiding slot elongated in a third direction that is different from the first direction and the second direction, and
a guided piece which is slidably engaged in the guiding slot; and
a protective ring which is configured to shield the robot fingers when the ion beam is applied on the substrate, and which is connected to the guide piece of each of the two guiding portions so as to slide along the third direction with the guide piece.

2. The apparatus as claimed in claim 1, wherein the platform is an electrostatic chuck.

3. The apparatus as claimed in claim 1, wherein the robot fingers are operable to move among a lay-down position, where the fingertip of each of the robot fingers is disposed at the second side of the platform, a lift-up position, where the fingertip of each of the robot fingers is disposed at the first side of the platform and in free contact with the substrate, and a retaining position, where the fingertip of each of the robot fingers retains the substrate.

4. The apparatus as claimed in claim 3, wherein each of the robot fingers further includes
a first segment mounted to the supporting frame, and
a second segment connected between the first segment and the fingertip to form a first angle with the first segment, and to form a second angle with the fingertip.

5. The apparatus as claimed in claim 4, wherein the first segment is elongated along a first axis and is actuable to rotate about the first axis such that by actuating the first segment of each of the robot fingers to rotate about the first axis, the fingertip of each of the robot fingers is permitted to be moved between the first side and the second side of the supporting frame.

6. The apparatus as claimed in claim 4, wherein the first segment is elongated along a first axis and is actuable to slide along the first axis relative to the supporting frame between an extended position and a retracted position, when the robot fingers are in each of the lay-down position and the lift-up position, the first segment is in the extended position, and when the fingertip of each of the robot fingers is at the first side of the supporting frame, by actuating the first segment of each of the robot fingers to slide from the extended position toward the retracted position, the robot fingers are moved from the lift-up position to the retaining position.

7. The apparatus as claimed in claim 4, wherein the first segment is elongated along a first axis and is actuable to slide along the first axis relative to the supporting frame between an extended position and a retracted position, the second segment is actuable to rotate relative to the first segment so as to permit the robot fingers to be further operable to move between the lay-down position and a collapsed position, when the robot fingers are in each of the lay-down position and the lift-up position, the first segment is in the extended position, when the robot fingers are in the collapsed position, the first segment is in the retracted position, and the fingertip is proximate to the supporting frame when the robot fingers are in the collapsed position and is distal from the supporting frame when the robot fingers are in the lay-down position, such that in response to movement of the robot fingers from the collapsed position to the lay-down position, the first angle between the first segment and the second segment is increased.

8. The apparatus as claimed in claim 4, wherein the second segment is elongated along a second axis, and the fingertip is actuable to rotate relative to the second segment about the second axis so as to permit the robot fingers to be displaced between the retaining position and the lift-up position.

9. An apparatus, comprising:

a robot including a supporting frame, a platform supported by the supporting frame and having a first side and a second side opposite to the first side, and robot fingers which are mounted to the supporting frame, and which are angularly displaced from each other, each of the robot fingers having a fingertip configured to retain a substrate on the first side of the platform such that the substrate is spaced apart from the platform;

an ion-beam generator disposed to apply an ion beam to the substrate;

an ion beam extractor configured for controlling a beam size of the ion beam, the ion beam extractor being disposed between the ion beam generator and the robot, such that the robot, the ion beam extractor and the ion beam generator are arranged along a first direction; and a protective ring disposed between the ion beam extractor and the robot such that when the ion beam is applied on the substrate, the robot fingers are shielded by the protective ring, the ion beam extractor including a main portion formed with a slit which is elongated in a second direction different from the first direction and disposed in a way that the ion beam from the ion-beam generator passes through the slit to reach the substrate, and two guiding portions which are connected to the main portion and are located at two opposite sides of the slit in the second direction, each of the guiding portions having a guide rail formed with a guiding slot elongated in a third direction that is different from the first direction and the second direction, and a guided piece having a first end and a second end, the first end being slidably engaged in the guiding slot, the second end being configured to retain the protective ring such that in response to movement of the substrate along the third direction, the guided piece is actuated to slide up and down in the guiding slot, and the protective ring is moved up and down along with the substrate.

10. The apparatus as claimed in claim 9, wherein the protective ring is made of an electrically conductive carbon-containing material.

11. The apparatus as claimed in claim 10, wherein the protective ring is made of graphite.

12. The apparatus as claimed in claim 9, wherein, when the substrate is retained by the fingertip of each of the robot fingers, the protective ring has an inner radius which is not less than a radius of the substrate by 0.5 mm, and which is not greater than the radius of the substrate by 0.5 mm.

13. The apparatus as claimed in claim 12, wherein the protective ring further has an outer radius, and a difference between the inner radius and the outer radius ranges from 10 mm to 30 mm.

14. The apparatus as claimed in claim 9, wherein each of the robot fingers is coated with an electrically conductive carbon-containing material.

15. The apparatus as claimed in claim 14, wherein each of the robot fingers is made of perfluoroalkoxy alkanes, and the electrically conductive carbon-containing material is graphite.

16. The apparatus as claimed in claim 9, further comprising a transfer unit configured for transferring and flipping the substrate before the fingertips of the robot fingers retain the substrate.

17. The apparatus as claimed in claim 9, wherein a number of the robot fingers is at least three.

18. An apparatus, comprising:

a robot including a supporting frame, and robot fingers which are mounted to the supporting frame, and which are angularly displaced from each other, each of the robot fingers having a fingertip configured to retain a substrate;

an ion-beam generator disposed to apply an ion beam to the substrate;

a protective ring disposed between the ion beam generator and the robot such that when the ion beam is applied on the substrate, the robot fingers are shielded by the protective ring; and an ion beam extractor which is disposed between the ion beam generator and the robot, and which is configured for controlling a beam size of the ion beam, the robot, the ion beam extractor and the ion beam generator being arranged along a first direction, the ion beam extractor including a main portion formed with a slit which is elongated in a second direction different from the first direction, and two guiding portions which are connected to the main portion and are located at two opposite sides of the slit in the second direction, each of the two guiding portions having a guide rail formed with a guiding slot elongated in a third direction that is different from the first direction and the second direction, and a guided piece having a first end and a second end, the first end being slidably engaged in the guiding slot, the second end being configured to retain the protective ring such that in response to movement of the substrate along the third direction, the guided piece is actuated to slide up and down in the guiding slot, and the protective ring is moved up and down along with the substrate.

19. The apparatus as claimed in claim 18, wherein the robot further includes a base structure which is connected to the supporting frame and which is actuable to move up and down so as to permit the substrate to move up and down with the base structure along the third direction.

20. The apparatus as claimed in claim 18, wherein the protective ring is disposed between the ion beam extractor and the robot.

\*  \*  \*  \*  \*